United States Patent
Kitamura et al.

(10) Patent No.: US 11,915,769 B2
(45) Date of Patent: Feb. 27, 2024

(54) NON-VOLATILE MEMORY WITH ISOLATION LATCH SHARED BETWEEN DATA LATCH GROUPS

(71) Applicant: SanDisk Technologies LLC, Addison, TX (US)

(72) Inventors: Kei Kitamura, Chigasaki (JP); Iris Lu, Fremont, CA (US); Tai-Yuan Tseng, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 108 days.

(21) Appl. No.: 17/745,120

(22) Filed: May 16, 2022

(65) Prior Publication Data

US 2023/0368852 A1 Nov. 16, 2023

(51) Int. Cl.
| | |
|---|---|
| *G11C 16/34* | (2006.01) |
| *G11C 7/10* | (2006.01) |
| *G11C 16/10* | (2006.01) |
| *G11C 16/24* | (2006.01) |
| *G11C 16/26* | (2006.01) |

(52) U.S. Cl.
CPC ........ *G11C 16/3459* (2013.01); *G11C 7/1039* (2013.01); *G11C 7/1048* (2013.01); *G11C 16/102* (2013.01); *G11C 16/24* (2013.01); *G11C 16/26* (2013.01)

(58) Field of Classification Search
CPC . G11C 16/3459; G11C 7/1039; G11C 7/1048; G11C 16/102; G11C 16/24; G11C 16/26
USPC .................................................. 365/185.22
See application file for complete search history.

(56) References Cited

U.S. PATENT DOCUMENTS

| | | | |
|---|---|---|---|
| 7,872,941 B2 | 1/2011 | Jung | |
| 9,748,001 B2 | 8/2017 | Li et al. | |
| 9,754,642 B2 | 9/2017 | Takagiwa | |
| 10,103,716 B2 | 10/2018 | Takagiwa | |
| 10,825,526 B1 | 11/2020 | Li et al. | |
| 2023/0085405 A1* | 3/2023 | Hsu ........................ | G11C 16/10 365/185.21 |

\* cited by examiner

*Primary Examiner* — Fernando Hidalgo
(74) *Attorney, Agent, or Firm* — Vierra Magen Marcus LLP

(57) ABSTRACT

A non-volatile memory device includes a control circuit configured to connect to a bit line that is connected to one or more non-volatile memory cells. The control circuit includes a first plurality of data latches connected to a first local data bus to store first program-verify pass/fail bits and a second plurality of data latches connected to a second local data bus to store second program-verify pass/fail bits for second non-volatile memory cells. The non-volatile memory device further includes a shared isolation latch and one or more interface circuits connected to the first local data bus and the second local data bus. The one or more interface circuits are configured to selectively block the first program-verify pass/fail bits from the first plurality of latches and the second program-verify pass/fail bits from the second plurality of latches according to an indicator bit stored in the shared isolation latch.

20 Claims, 19 Drawing Sheets

Figure 7A
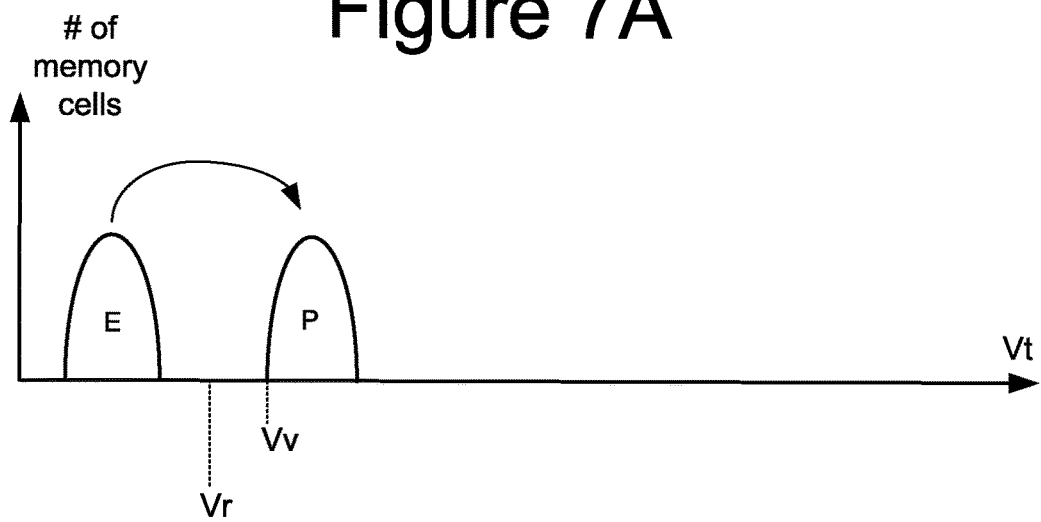
Figure 7B
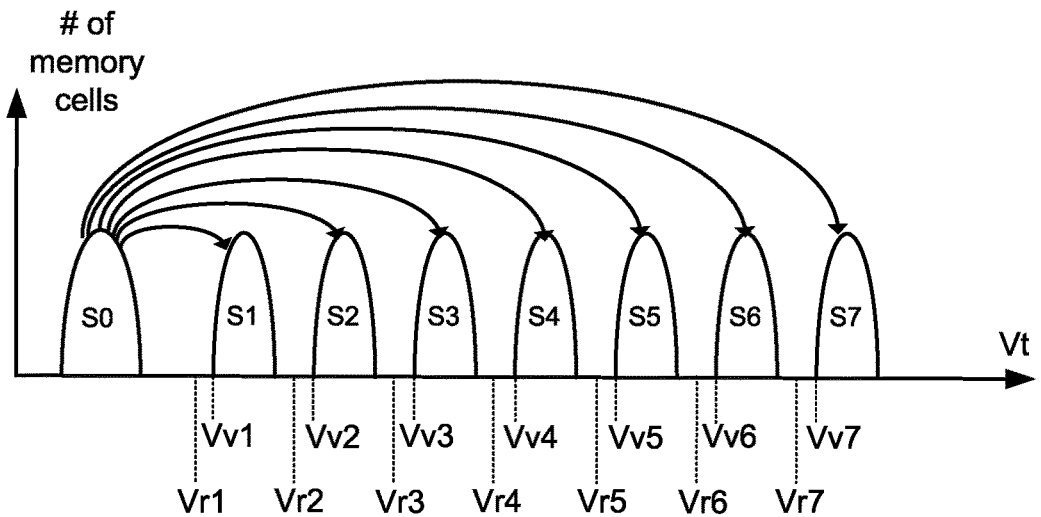
Figure 7C
|             | S0 | S1 | S2 | S3 | S4 | S5 | S6 | S7 |
|-------------|----|----|----|----|----|----|----|----|
| Upper Page  | 1  | 1  | 1  | 0  | 0  | 0  | 0  | 1  |
| Middle Page | 1  | 1  | 0  | 0  | 1  | 1  | 0  | 0  |
| Lower Page  | 1  | 0  | 0  | 0  | 0  | 1  | 1  | 1  |

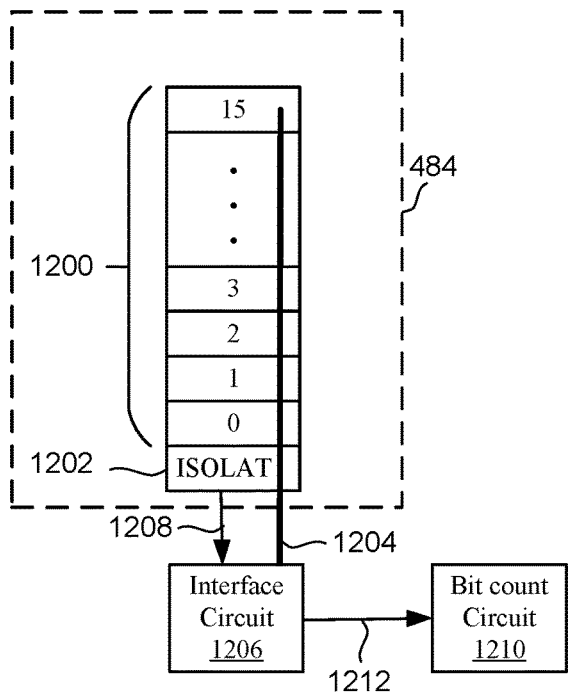
Figure 12A
| DBUS | ISOLAT | DNOR |
|---|---|---|
| 1 (Pass) | 0 | 1 |
| 1 (Pass) | 1 (defective) | 1 |
| 0 (Fail) | 0 | 0 |
| 0 (Fail) | 1 (defective) | 1 |
Figure 12B
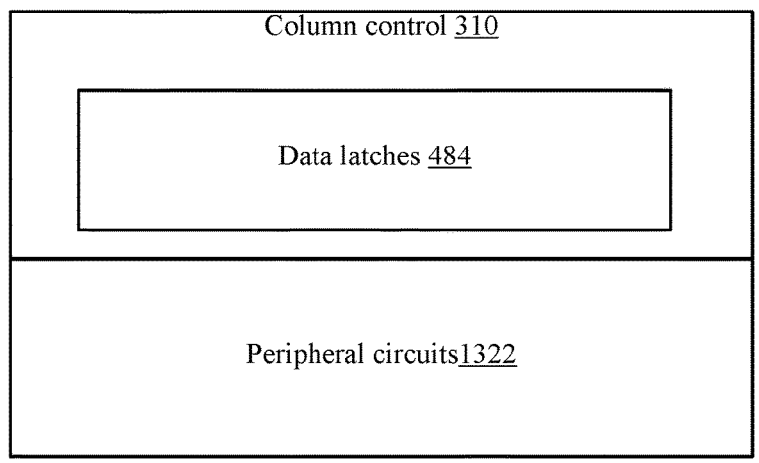
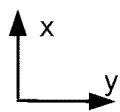
Figure 13

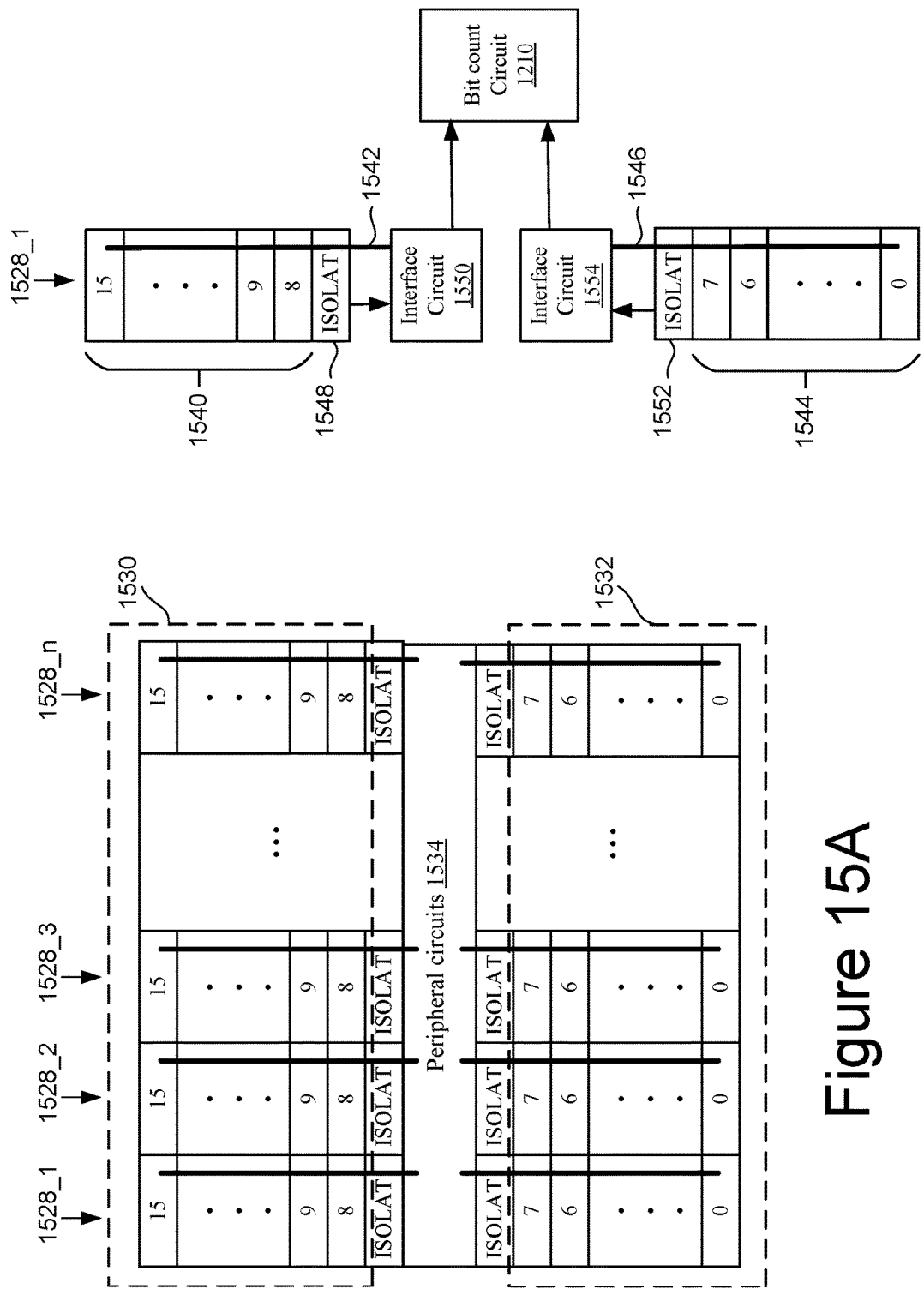

| DL | DBUS_T | ISOLAT | DNOR_T | DBUS_B= DNOR_B | OR |
|---|---|---|---|---|---|
| 1 (Pass) | 1 | 0 | 1 | 0 | 1 |
| 1 (Pass) | 1 | 1 (defective) | 1 | 0 | 1 |
| 0 (Fail) | 0 | 0 | 0 | 0 | 0 |
| 0 (Fail) | 0 | 1 (defective) | 1 | 0 | 1 |

Figure 16C

| DBUS_T | ISOLAT | DNOR_T | DL | DBUS_B= DNOR_B | OR |
|---|---|---|---|---|---|
| 0 | 0 | 0 | 1 (Pass) | 1 | 1 |
| 0 | 1 (defective) | 1 | 1 (Pass) | 1 | 1 |
| 0 | 0 | 0 | 0 (Fail) | 0 | 0 |
| 0 | 1 (defective) | 1 | 0 (Fail) | 0 | 1 |

Figure 16D

NON-VOLATILE MEMORY WITH ISOLATION LATCH SHARED BETWEEN DATA LATCH GROUPS

BACKGROUND

The present disclosure relates to technology for non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). An example of non-volatile memory is flash memory (e.g., NAND-type and NOR-type flash memory). Users of non-volatile memory typically want the memory to operate at high speeds so that they do not need to wait for memory operations to be completed.

BRIEF DESCRIPTION OF THE DRAWINGS

Like-numbered elements refer to common components in the different figures.

FIG. 7A depicts threshold voltage distributions of memory cells in a binary embodiment.

FIG. 7B depicts threshold voltage distributions of memory cells in a multi-level cell (MLC) embodiment.

FIG. 7C is a table describing one example of an assignment of data values to data states.

FIGS. 12A-B illustrate an example of a column of latches with an isolation latch.

FIG. 13 illustrates an example of a memory array and control circuits that include data latches.

FIGS. 15A-B illustrate an example of columns of latches in which each column has two local data busses and two isolation latches.

FIGS. 16A-D illustrate an example of columns of latches in which each column has two local data busses and a shared isolation latch.

DETAILED DESCRIPTION

Non-volatile memory cells are programmed by applying a programming signal as a series of programming voltage pulses (or other doses of programming) to selected memory cells and verifying the memory cells between programming voltage pulses (program-verify). For memory devices storing data in a multi-level memory cell, or MLC, format, the memory device will typically perform multiple sensing operations as part of the program-verify process. The verify status (pass or fail) of each cell that is subject to program-verify may be stored in a corresponding latch and the contents of such latches may be aggregated to determine whether to perform further programming. For example, if the number of program-verify pass/fail bits indicating program-verify failure is greater than a threshold, then one or more additional programming pulse may be applied. If the number of program-verify fail bits is less than the threshold, then programming may be considered successful, and no more programming pulses may be necessary.

To accurately count the number of program-verify fail bits, it may be desirable to exclude program-verify fail bits obtained from bad columns. Bad columns of non-volatile memory cells may be identified by testing and may not be usable (e.g., may not be successfully programmed and/or program-verified). Including such columns from a count of program-verify pass/fail bits could skew the result negatively (unnecessarily increase the number of fails) and could result in unnecessary programming pulses and/or finding a program fail condition. Bad columns may be excluded using isolation latches that contain indicator bits that are set for bad columns. Program-verify fail bits from bad columns can then be identified and excluded from a count of program-verify fails.

In some cases, a column of data latches that holds program-verify pass/fail bits from memory cells of a bit line (e.g., a column of non-volatile memory cells) is split into two groups of latches, each with an isolation latch to enable selective blocking of program-verify pass/fail bits (e.g., blocking program-verify fail bits from bad columns). In other examples, a column of data latches is split into two groups of data latches with a shared isolation latch. Using a shared isolation latch can reduce the number of components and thus reduce space occupied by data latches.

FIGS. 1A-6 describe one example of a storage system that can be used to implement the technology disclosed herein.

Figure 1A:
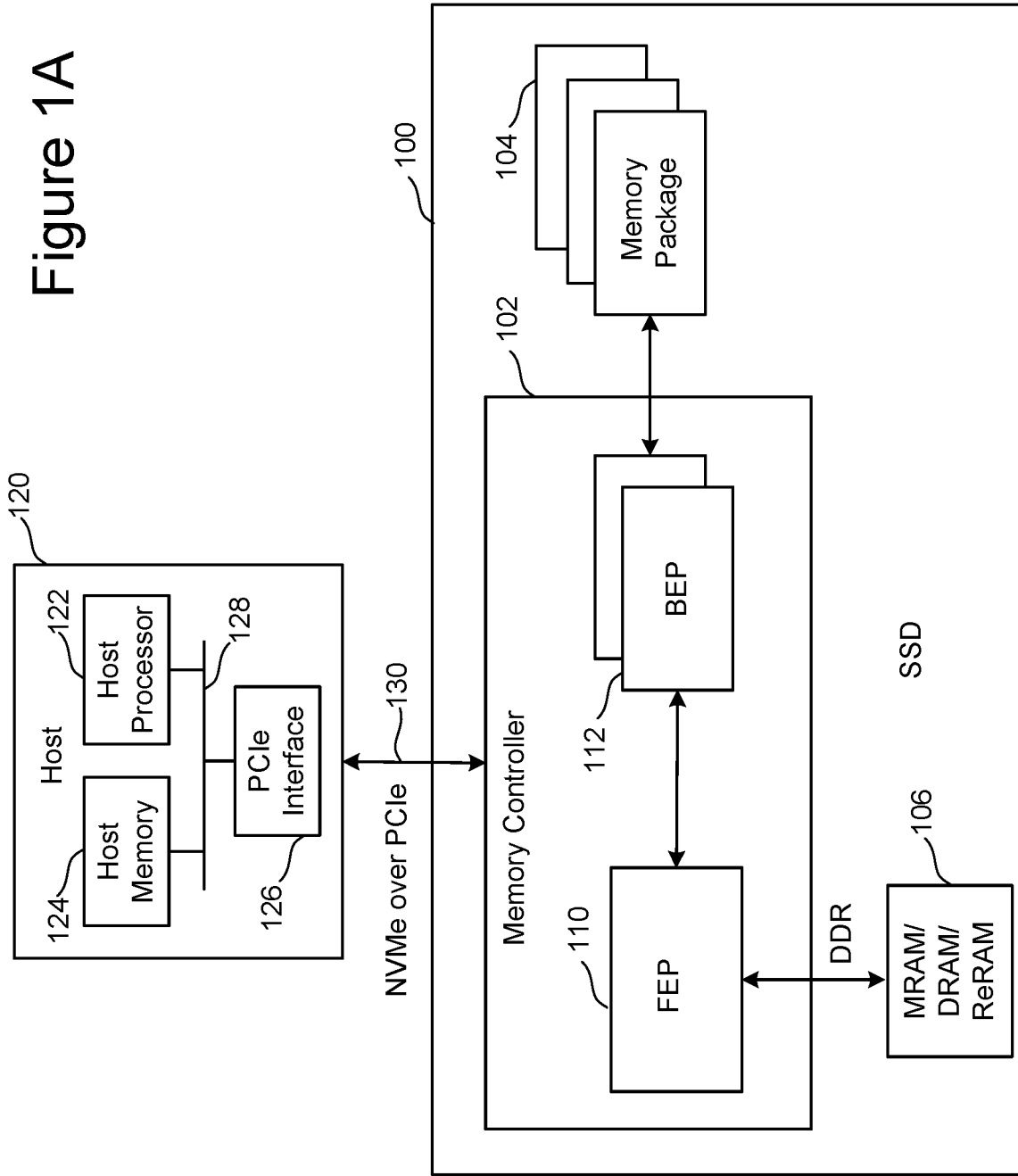
FIG. 1A is a block diagram of one embodiment of a storage system connected to a host.

FIG. 1A is a block diagram of one embodiment of a storage system 100 connected to a host system 120. Storage system 100 can implement the technology disclosed herein. Many different types of storage systems can be used with the technology disclosed herein. One example storage system is a solid state drive ("SSD"); however, other types of storage systems can also be used. Storage system 100 comprises a memory controller 102, memory package 104 for storing data, and local memory (e.g., MRAM/DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master, and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two dimensional NAND flash memory and/or three dimensional NAND flash memory). In other embodiments, the memory package 104 can include other types of memory; for example, the memory package can include Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory or another type of storage. Host system 120 is external to and separate from storage system 100. In one embodiment, storage system 100 is embedded in host system 120. In other embodiments, the controller 102 may communicate with host 120 via other types of communication buses and/or links, including for example, over an NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like. For simplicity, the example embodiments below will be described with respect to a PCIe example.

Figure 1B:
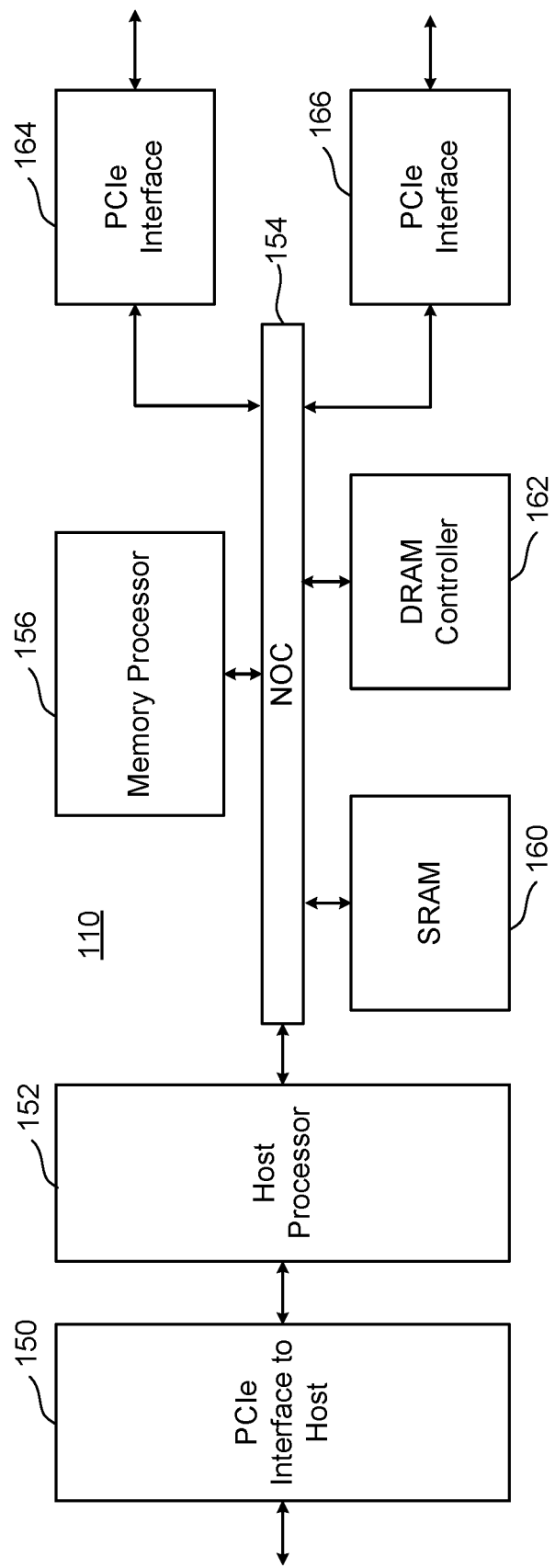
FIG. 1B is a block diagram of one embodiment of a Front End Processor Circuit.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the local memory 106 (e.g., DRAM/MRAM/ReRAM). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

Figure 2A:
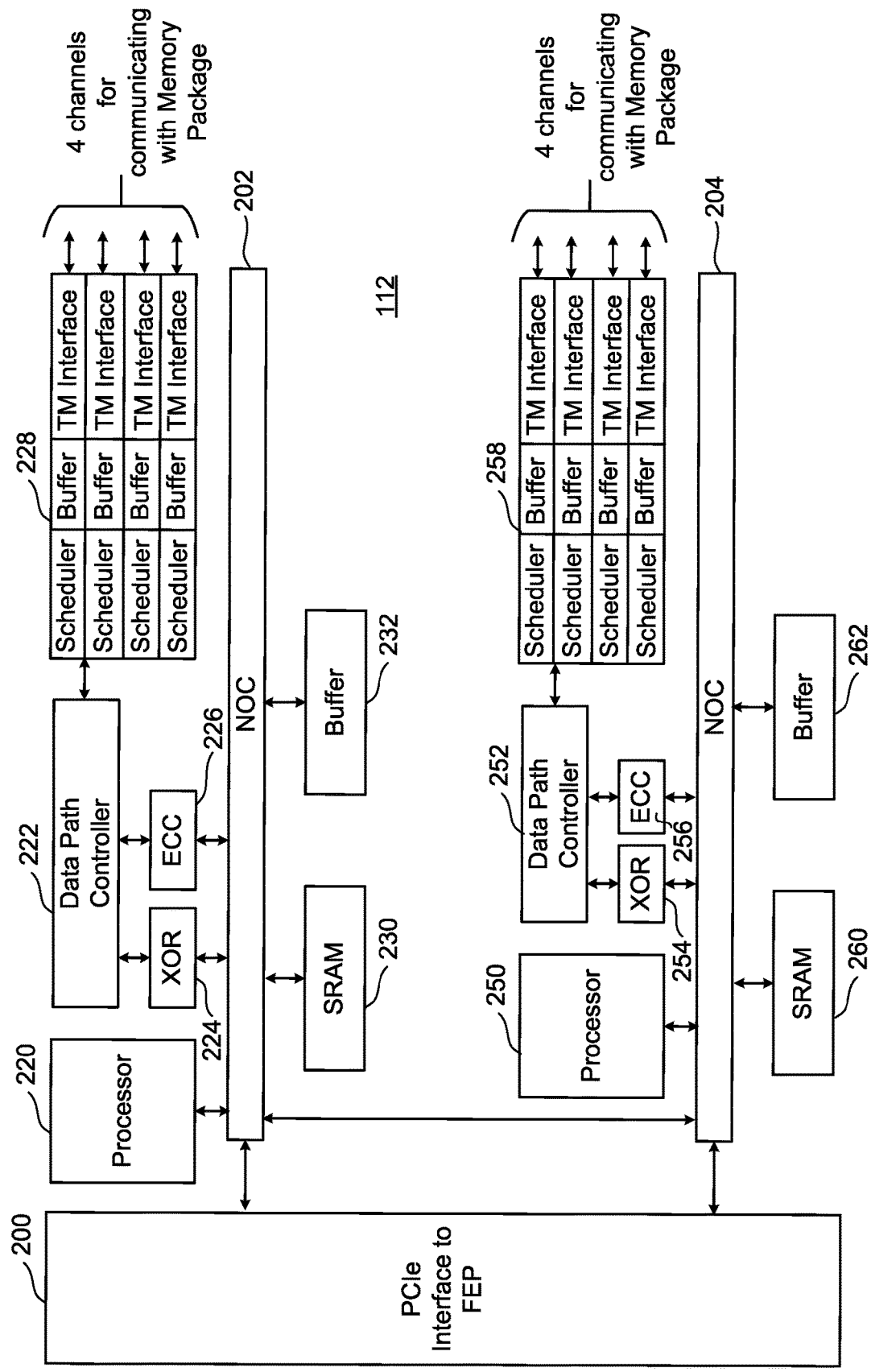
FIG. 2A is a block diagram of one embodiment of a Back End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 are able to recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
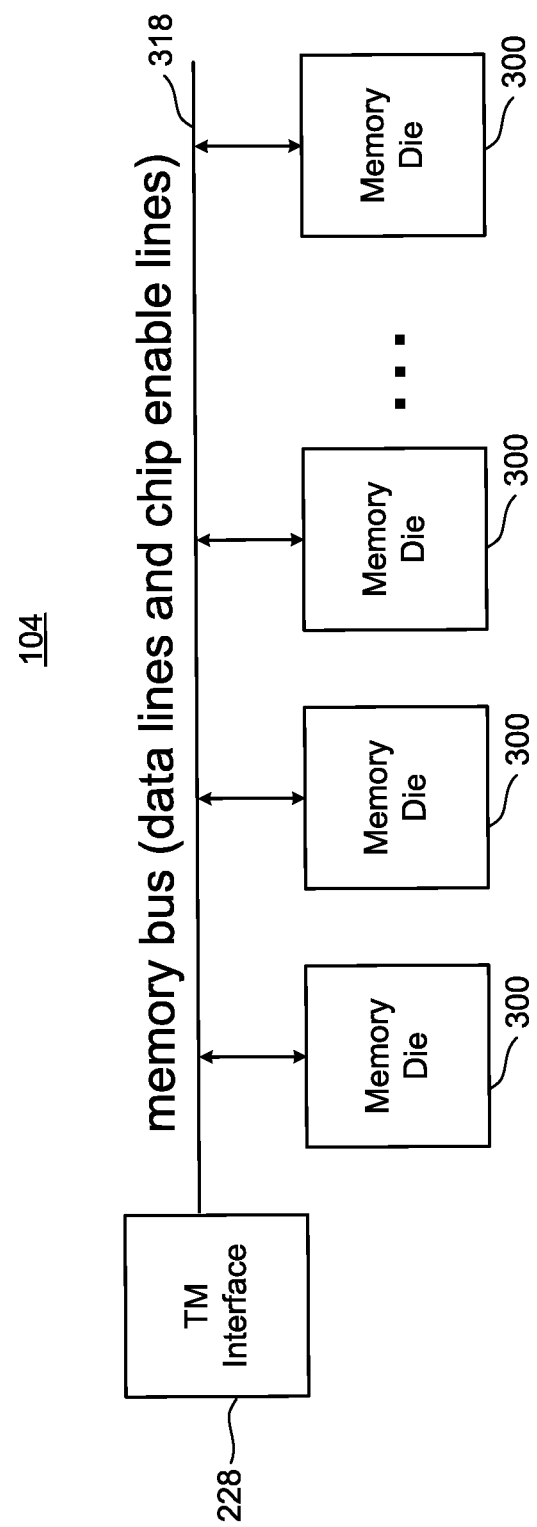
FIG. 2B is a block diagram of one embodiment of a memory package.

FIG. 2B is a block diagram of one embodiment of a memory package 104 that includes a plurality of memory dies 300 connected to a bus (data lines and chip enable lines) 318. The data bus 318 (memory bus) connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or sixteen memory die; however, other numbers of memory die can also be implemented. The technology described herein is not limited to any particular number of memory die. In some embodiments, the memory package can also include a processor, CPU device, such as a RISC-V CPU along with some amount of RAM to help implement some of capabilities described below. The technology described herein is not limited to any particular number of memory die.

Figure 3A:
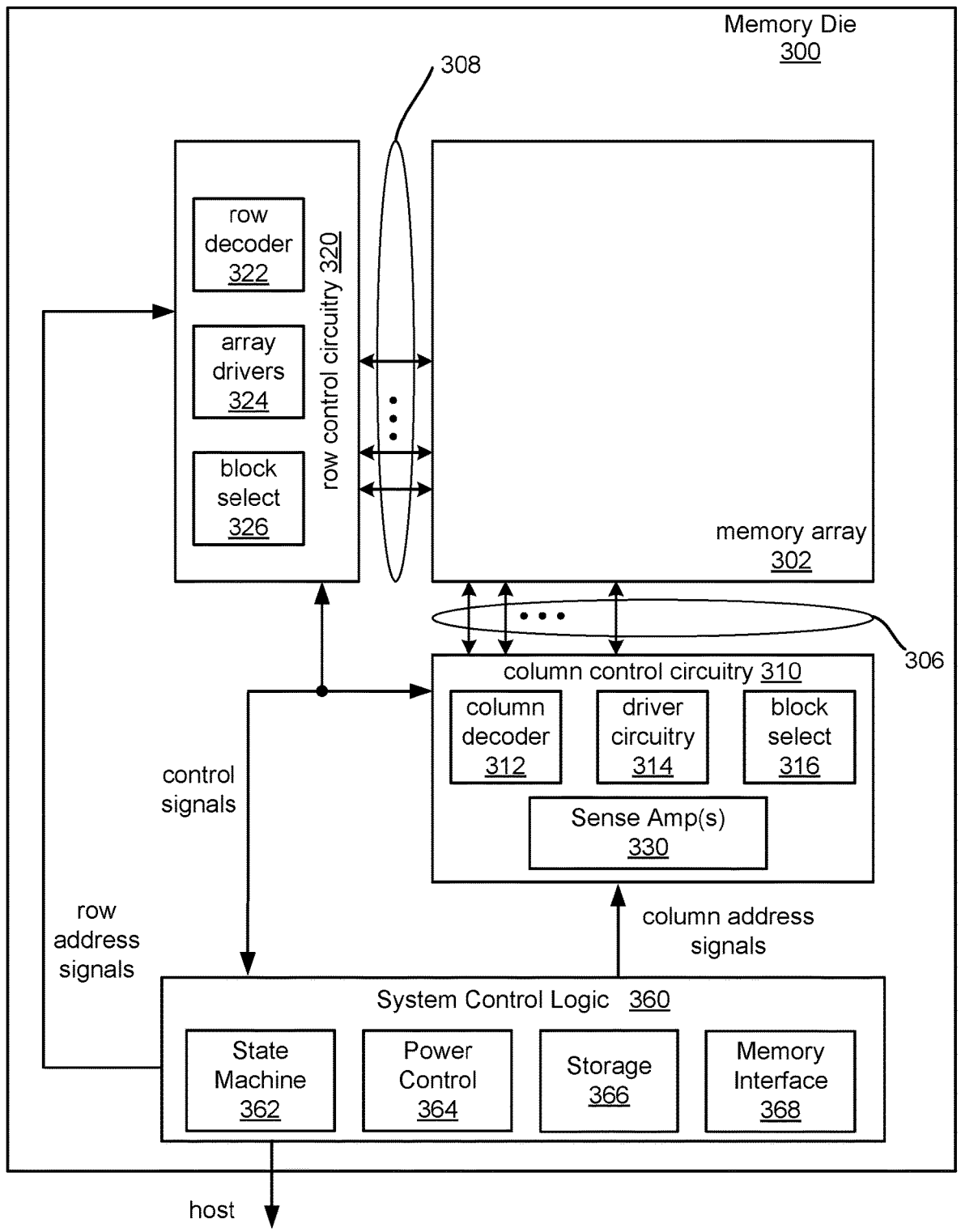
FIG. 3A is a functional block diagram of an embodiment of a memory die.

FIG. 3A is a block diagram that depicts one example of a memory die 300 that can implement the technology described herein. Memory die 300, which can correspond to one of the memory die 300 of FIG. 2B, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs are connected to respective word lines of the memory array 302 via electrical paths 308. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs are connected to respective bit lines of the memory array 302. Although only single block is shown for memory structure 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

System control logic 360 receives data and commands from a host and provides output data and status to the host. In other embodiments, system control logic 360 receives data and commands from a separate controller circuit and provides output data to that controller circuit, with the controller circuit communicating with the host. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 controls the power and voltages supplied to the rows and columns of the memory structure 302 during memory operations and may include charge pumps and regulator circuit for creating regulating voltages. System control logic 360 includes storage 366, which may be used to store parameters for operating the memory array 302.

Commands and data are transferred between the controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the controller 102.

In some embodiments, all of the elements of memory die 300, including the system control logic 360, can be formed as part of a single die. In other embodiments, some or all of the system control logic 360 can be formed on a different die.

For purposes of this document, the phrase "control circuit(s)" can include a controller, a state machine, a micro-controller, micro-processor, and/or other control circuitry as represented by the system control logic 360, column control circuitry 310 or other analogous circuits that are used to control non-volatile memory.

In one embodiment, memory structure 302 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts, the structure of memory structure 302 of the memory cells and the peripheral circuitry, including all of the other elements. An important characteristic of a memory circuit is its capacity, which can be increased by increasing the area of the memory die of storage system 100 that is given over to the memory structure 302; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the storage system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders, latches, and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 3B:
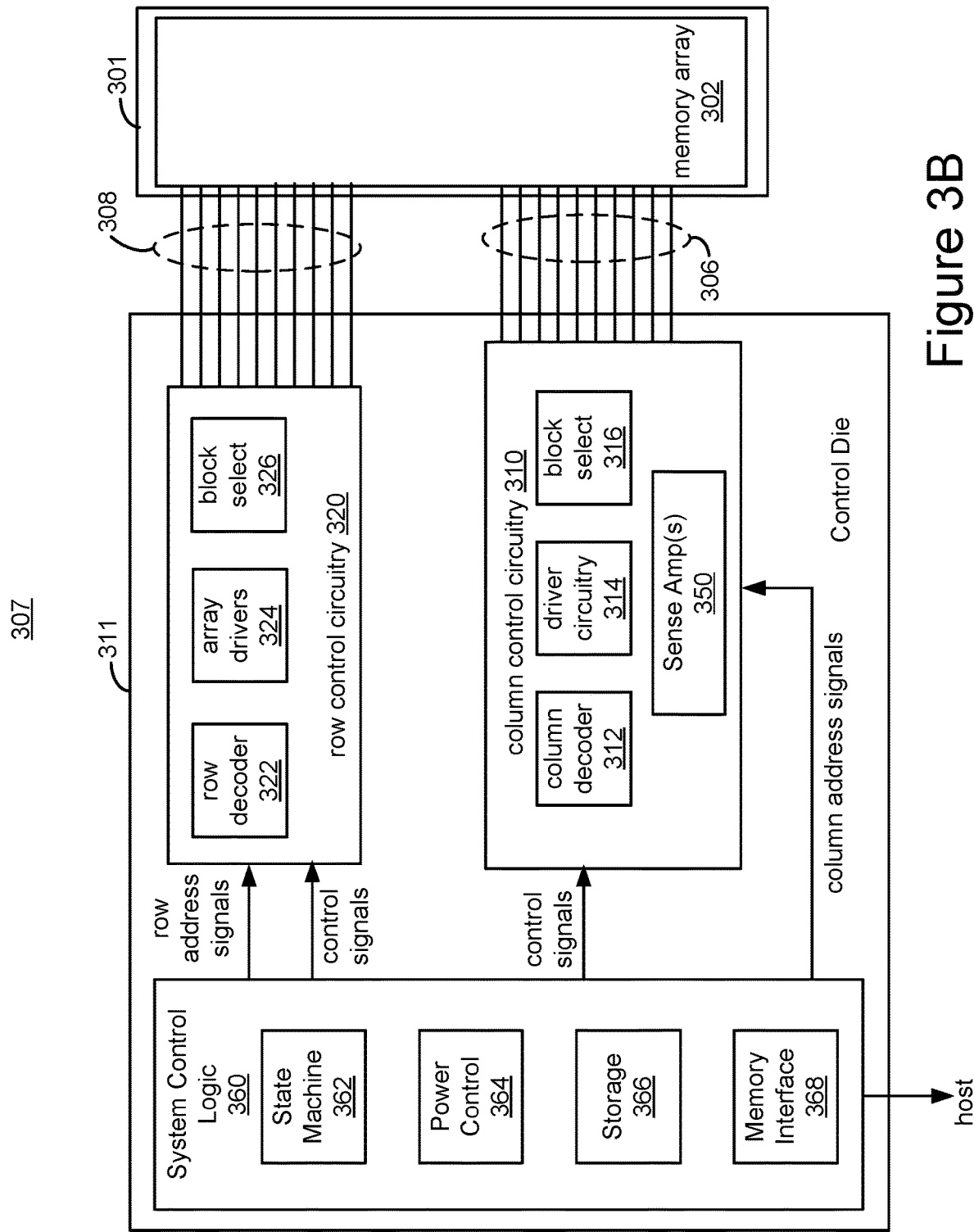
FIG. 3B is a functional block diagram of an embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. The integrated memory assembly 307 may be used in a memory package 104 in storage system 100. The integrated memory assembly 307 includes two types of semiconductor die (or more succinctly, "die"). Memory structure die 301 includes memory structure 302. Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. It can be seen that system control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 3B shows column control circuitry 310 including sense amplifier(s) 350 on the control die 311 coupled to memory structure 302 on the memory structure die 301 through electrical paths 306. For example, electrical paths 306 may provide electrical connection between column decoder 312, driver 314, and block select circuitry 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select circuitry 326 are coupled to memory structure 302 through electrical paths 308. Each of electrical path 308 may correspond to a word line, dummy word line, or select gate line. Additional electrical paths may also be provided between control die 311 and memory structure die 301.

For purposes of this document, the phrase "control circuit(s)" can include one or more of controller 102, system control logic 360, column control circuitry 310, row control circuitry 320, a micro-controller, a state machine, and/or other control circuitry, or other analogous circuits that are used to control non-volatile memory. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 4:
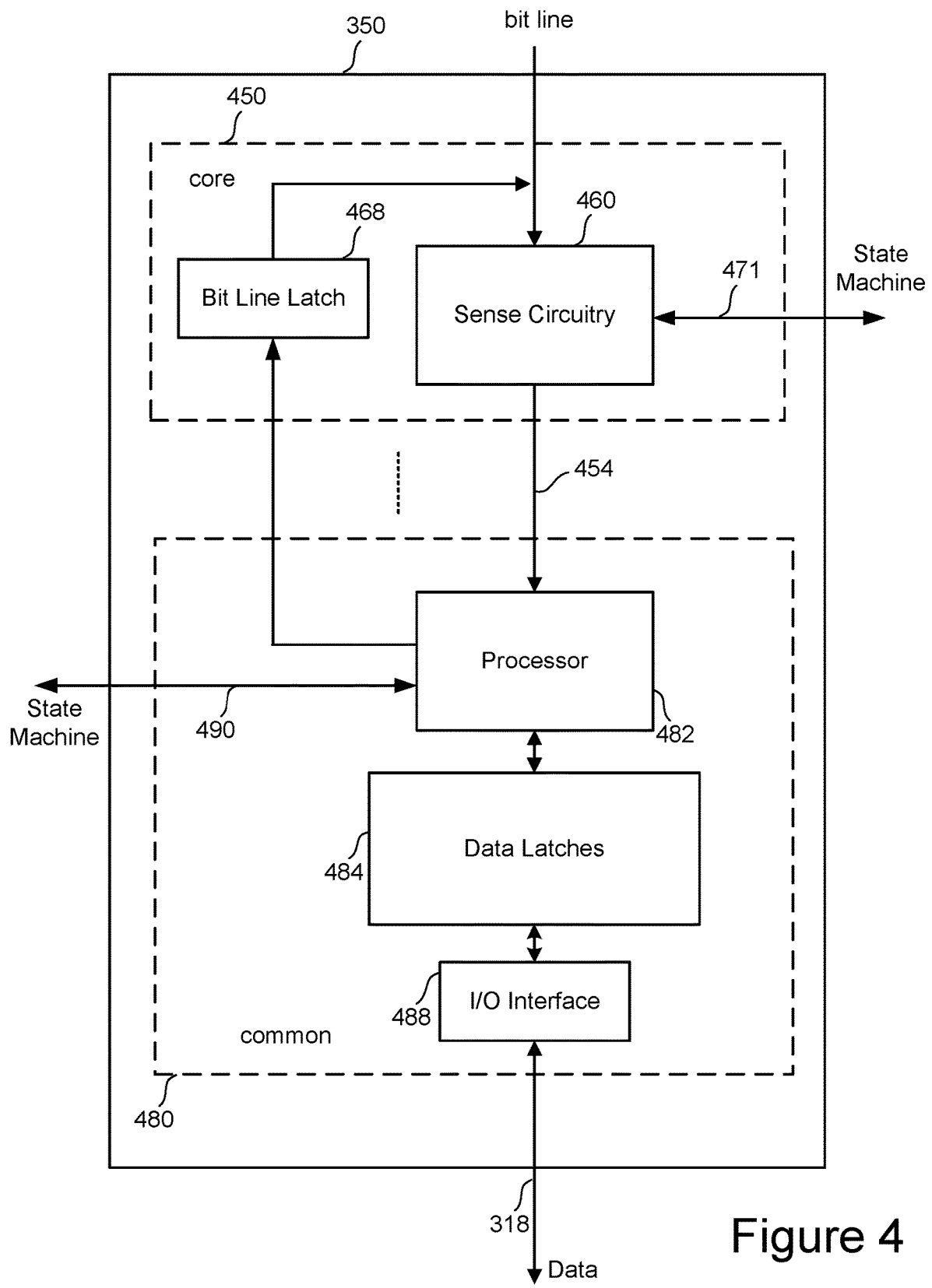
FIG. 4 is a block diagram of an individual sense block partitioned into a core portion and a common portion.

FIG. 4 is a block diagram of an individual sense block of sense amplifiers 350 partitioned into a core portion, referred to as a sense module 450, and a common portion 480. In one embodiment, there will be a separate sense module 450 for each bit line and one common portion 480 for a set of multiple sense modules 450. In one example, a sense block will include one common portion 480 and eight, twelve, or sixteen sense modules 450. Each of the sense modules in a group will communicate with the associated common portion via a data bus 454.

Sense module 450 comprises sense circuitry 460 that determines whether a conduction current in a connected bit line is above or below a predetermined level or, in voltage based sensing, whether a voltage level in a connected bit line is above or below a predetermined level. The sense circuitry 460 is configured to received control signals from the state machine via input lines 471. In some embodiments, sense module 450 includes a circuit commonly referred to as a sense amplifier. Sense module 450 also includes a bit line latch 468 that is used to set a voltage condition on the connected bit line. For example, a predetermined state latched in bit line latch 468 will result in the connected bit line being pulled to a state designating program inhibit (e.g., Vdd).

Common portion 480 comprises a processor 482, a set of data latches 484 and an I/O Interface 488 coupled between the set of data latches 484 and data bus 318. Processor 482 performs computations. For example, one of its functions is to determine the data stored in the sensed memory cell and store the determined data in the set of data latches. The set of data latches 484 is used to store data bits determined by processor 482 during a read operation. It is also used to store data bits imported from the data bus 318 during a program operation. The imported data bits represent write data meant to be programmed into the memory. I/O Interface 488 provides an interface between data latches 484 and the data bus 318.

During read or sensing, the operation of the system is under the control of state machine 362 that controls (using power control 364) the supply of different control gate or other bias voltages to the addressed memory cell(s). As it steps through the various predefined control gate voltages corresponding to the various memory states supported by the memory, the sense module 450 may trip at one of these voltages and an output will be provided from sense module 450 to processor 482 via data bus 454. At that point, processor 482 determines the resultant memory state by consideration of the tripping event(s) of the sense module and the information about the applied control gate voltage from the state machine via input lines 490. It then computes a binary encoding for the memory state and stores the resultant data bits into data latches 484. In another embodiment of the core portion, bit line latch 468 serves double duty, both as a latch for latching the output of the sense module 450 and also as a bit line latch as described above.

Data latches 484 contains a stack of data latches (data latch stack) corresponding to the sense module. In one embodiment, data latches 484 includes three, four, eight, sixteen or another number of data latches. In one embodiment, the latches are each one bit.

During program, the data to be programmed is stored in the set of data latches 484 from the data bus 318. During the program-verify process, Processor 482 monitors the verified memory state relative to the desired memory state. When the two are in agreement, processor 482 sets the bit line latch 468 so as to cause the bit line to be pulled to a state designating program inhibit. This inhibits the memory cell coupled to the bit line from further programming even if it is subjected to programming pulses on its control gate. In other embodiments the processor initially loads the bit line latch 468 and the sense circuitry sets it to an inhibit value during the verify process.

In some implementations (but not required), the data latches are implemented as a shift register so that the parallel data stored therein is converted to serial data for data bus 318, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 5:
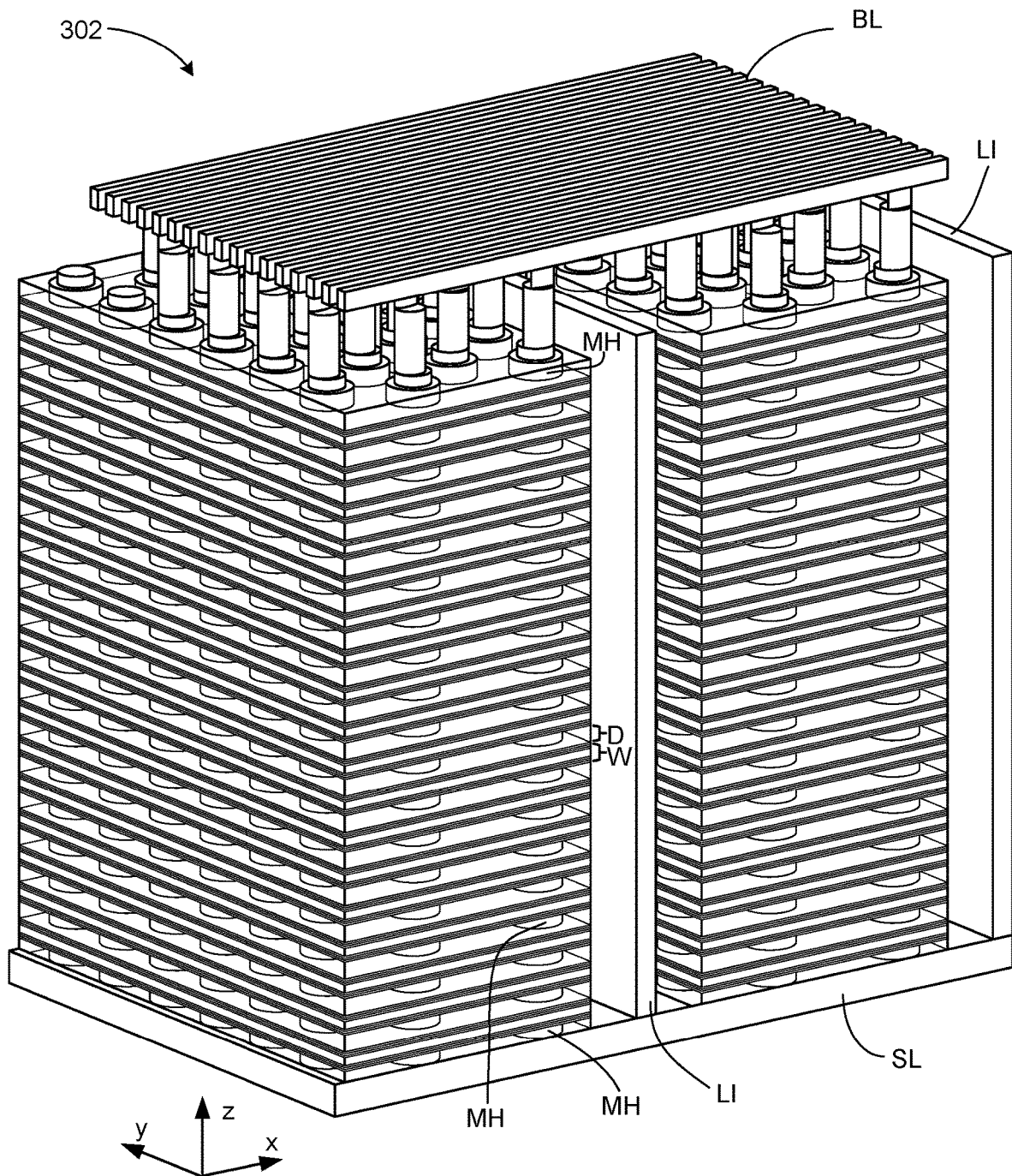
FIG. 5 is a perspective view of a portion of one example embodiment of a monolithic three dimensional memory array that can comprise memory structure.

FIG. 5 is a perspective view of a portion of one example embodiment of a monolithic three dimensional (3D) memory array that can comprise memory structure 302, which includes a plurality non-volatile memory cells. For example, FIG. 5 shows a portion of one block comprising memory. The structure depicted includes a set of bit lines BL (extending along the x-direction and separated in the y-direction) positioned above a stack of alternating dielectric layers and conductive layers with vertical columns of materials extending (in the z-direction) through the dielectric layers and conductive layers. For example purposes, one of the dielectric layers is marked as D and one of the conductive layers (also called word line layers) is marked as W. The word line layers contain one or more word lines that are connected to memory cells. For example, a word line may be connected to a control gate of a memory cell. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 5 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 5, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 6:
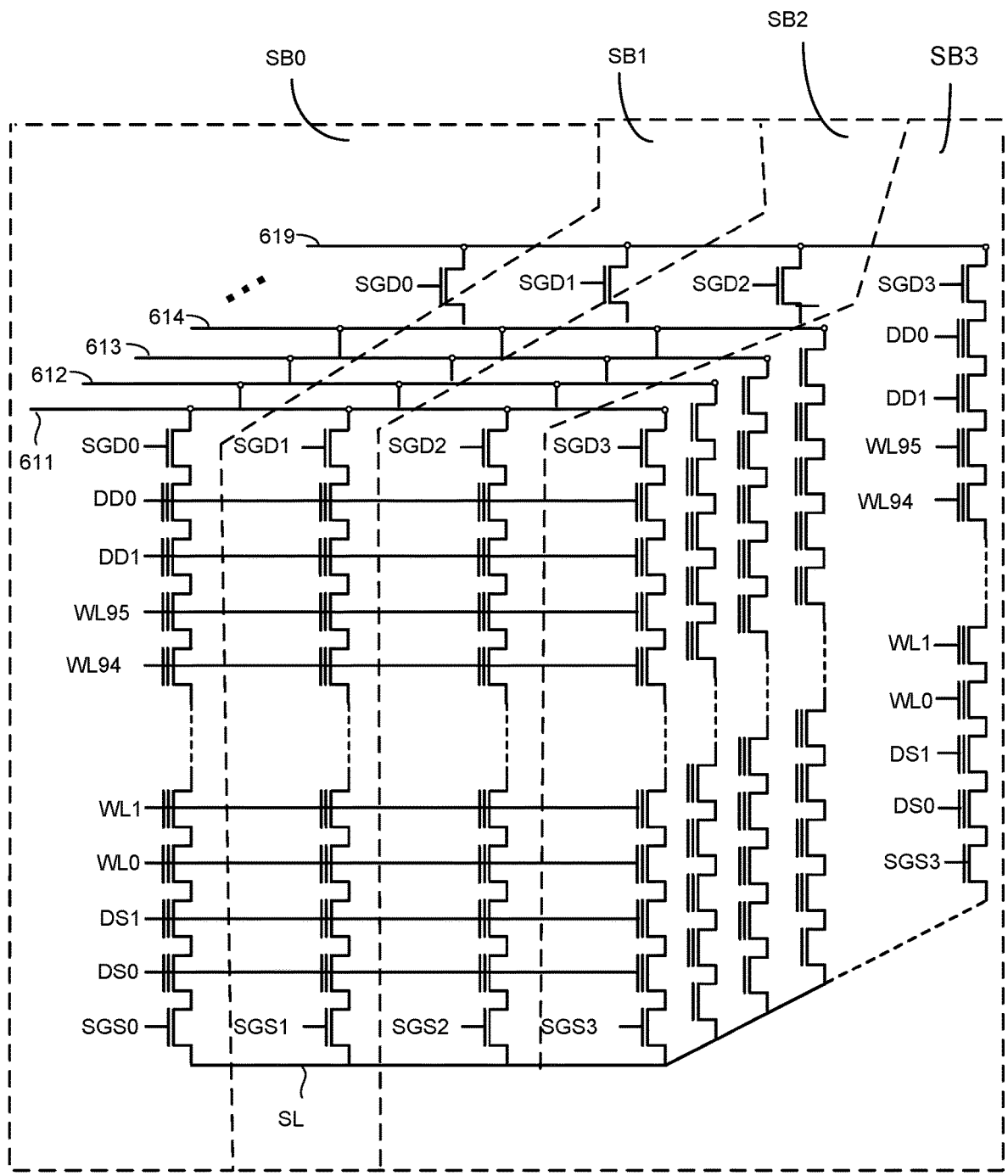
FIG. 6 is a schematic of a plurality of NAND strings showing multiple sub-blocks.

FIG. 6 is a schematic diagram of a portion of the memory depicted in in FIG. 5. FIG. 6 shows physical word lines WLL0-WLL95 running across the entire block. The structure of FIG. 6 corresponds to portion 606 in Block 2 of FIGS. 5-6E, including bit lines 611, 612, 613, 614, ..., 619. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 5-6 is a three dimensional memory structure that includes vertical NAND strings with charge-trapping material, other (2D and 3D) memory structures (e.g., MRAM, ReRAM, PCM) can also be used with the technology described herein.

FIG. 7A is a graph of threshold voltage versus number of memory cells and illustrates example threshold voltage distributions for the memory array when each memory cell stores one bit of data. FIG. 7A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." Memory cells that store one bit of data are referred to as single level cells ("SLC").

FIG. 7B is a graph of threshold voltage versus number of memory cells and illustrates example threshold voltage distributions for the memory array when each memory cell stores three bits of data. Other embodiments, however, may use other data capacities per memory cell (e.g., such as one, two, four, or five bits of data per memory cell). Memory cells that store more than one bit of data are referred to as multi-level cells ("MLC"). FIG. 7B shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed data states. In some embodiments, data states S1-S7 can overlap, with error correction used to identify the correct data being stored.

FIG. 7B shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in. In FIG. 7A, read reference voltage Vr is used to test whether memory cells are erased or programmed.

FIG. 7B also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 7B represent the full sequence programming. The technology described herein can also be used with other types of programming in addition to full sequence programming including (but not limited to) multiple stage/phase programming.

Each threshold voltage distribution (data state) of FIG. 7B corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 7C is a table describing one example of an assignment of data values to data states. In the table of FIG. 7B, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 6) or verify operation (e.g. see verify reference voltages Vv1, Vv2, Vv3, Vv4, Vv5, Vv6, and Vv7 of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 8:
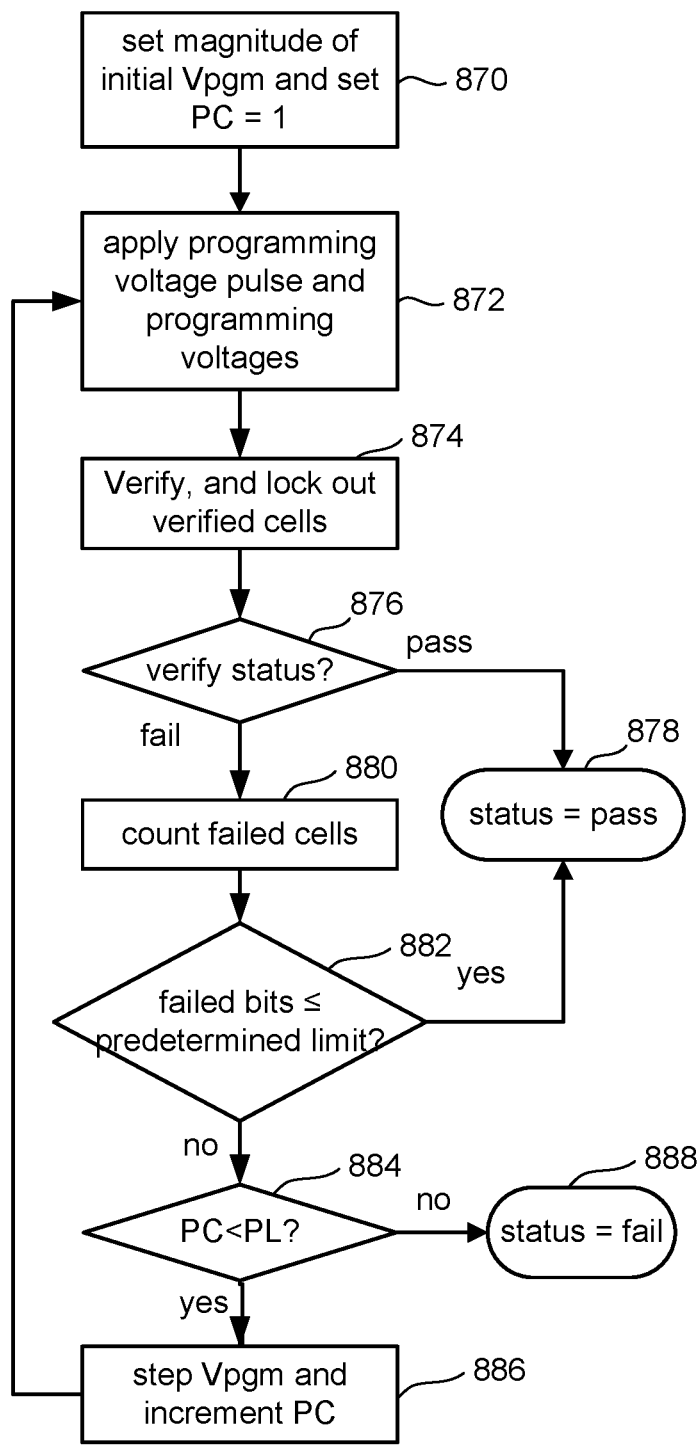
FIG. 8 is a flow chart describing one embodiment of a process for programming non-volatile memory.

FIG. 8 is a flowchart describing one embodiment of a process for programming that may be performed by memory die 300 or integrated memory assembly 307. In one example embodiment, the process of FIG. 8 is performed using one or more control circuit as discussed above, at the direction of state machine 362. The process of FIG. 8 is performed to implement the programming of FIG. 7A, the full sequence programming of FIG. 7B, or other programming schemes including multi-stage programming. When implementing multi-stage programming, the process of FIG. 8 is used to implement any/each stage of the multi-stage programming process.

Figure 9:
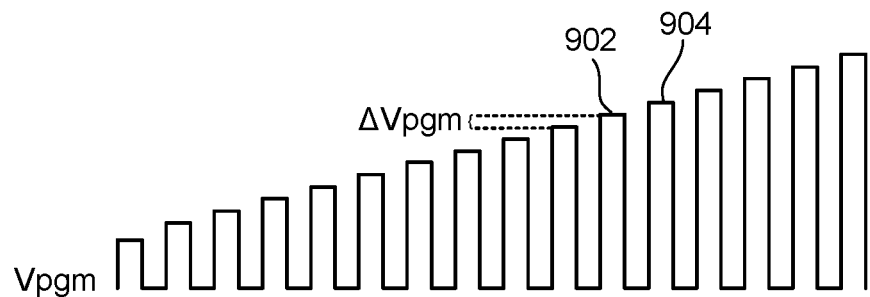
FIG. 9 depicts a series of programming voltage pulses.

Typically, a programming signal Vpgm is applied to the control gates (via a selected word line) during a program operation as a series of programming voltage pulses (e.g., as depicted in FIG. 9). Between programming pulses are a set of verify pulses to perform verification. In many implementations, the magnitude of the program pulses is increased with each successive pulse by a predetermined step size ΔVpgm (e.g., 0.2 v-0.5 v). In step 870 of FIG. 8, the programming voltage (Vpgm) is initialized to the starting magnitude (e.g., ~12-16V or another suitable level) and a program counter PC maintained by state machine 362 is initialized at 1. In step 872, a program pulse of the programming signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. In one embodiment, if a memory cell should be programmed, then the corresponding bit line is grounded. On the other hand, if the memory cell should remain at its current threshold voltage, then the corresponding bit line is connected to Vdd (e.g., 1-3.5 volts) to inhibit programming. In step 872, the programming voltage pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 874, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 876, it is determined whether all the memory cells have reached their target threshold voltages (pass). If so, the programming process is complete and successful because all selected memory cells were programmed and verified to their target states. A status of "PASS" (or success) is reported in step 878. If, in 876, it is determined that not all of the memory cells have reached their target threshold voltages (fail), then the programming process continues to step 880.

In step 880, the system counts the number of memory cells that have not yet reached their respective target threshold voltage distribution. That is, the system counts the number of memory cells that have, so far, failed the program-verify process. This counting can be done by the state machine 362, the controller 102, or other logic. In one embodiment, there is one total count, which reflects the total number of memory cells currently being programmed that have failed the last verify step. In another embodiment, separate counts are kept for each data state. For example, data latches 484 may store the status of one or more memory cells connected to a corresponding bit line. The status may be stored as one bit (one latch) per memory cell, one bit per data state per memory cell, or otherwise and the stored bits may then be counted to obtain a total failed bit count (e.g., a count of the number of cells that have not been successfully programmed).

In step 882, it is determined whether the count from step 880 is less than or equal to a predetermined limit. In one embodiment, the predetermined limit is a number of bits that can be corrected by error correction codes (ECC) during a read process for the page of memory cells. If the number of failed cells is less than or equal to the predetermined limit, then the programming process can stop, and a status of "PASS" is reported in step 878. In this situation, enough memory cells programmed correctly such that the few remaining memory cells that have not been completely programmed can be corrected using ECC during the read process. In some embodiments, step 880 will count the number of failed cells for each sector, each target data state or other unit, and those counts will individually or collectively be compared to one or more thresholds in step 882.

In one embodiment, the predetermined limit can be less than the total number of bits that can be corrected by ECC during a read process to allow for future errors. When programming less than all of the memory cells for a page or comparing a count for only one data state (or less than all states), then the predetermined limit can be a portion (pro-rata or not pro-rata) of the number of bits that can be corrected by ECC during a read process for the page of memory cells. In some embodiments, the limit is not pre-determined. Instead, it changes based on the number of errors already counted for the page, the number of program-erase cycles performed or other criteria.

If the number of failed memory cells is not less than the predetermined limit, than the programming process continues at step 884 and the program counter PC is checked against the program limit value (PL). Examples of program limit values include 6, 20 and 30; however, other values can be used. If the program counter PC is not less than the program limit value PL, then the program process is considered to have failed and a status of FAIL is reported in step 888. If the program counter PC is less than the program limit value PL, then the process continues at step 886 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 886, the process loops back to step 872 and another program pulse is applied to the selected word line so that another iteration (steps 872-886) of the programming process of FIG. 8 is performed.

FIG. 9 depicts the programming signal Vpgm as a series of programming voltage pulses. These programming voltage pulses are one example of doses of programming applied to a plurality of non-volatile memory cells being programmed to a data state. As described by FIG. 8, the system performs program verification between the doses of programming, as depicted in FIGS. 10 and 11.

Figure 10:
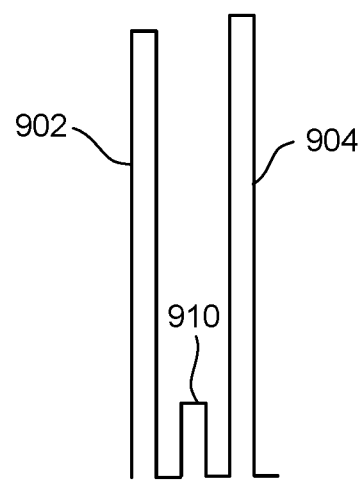
FIG. 10 depicts a two programming voltage pulses and a verify voltage pulse.

FIG. 10, which illustrates an embodiment in which memory cells store one bit of data per memory cell (e.g., as illustrated in FIG. 7A), depicts two of the programming voltage pulses 902 and 904 of FIG. 9. Between programming voltage pulses 902 and 904 is verify voltage pulse 910. In one embodiment, verify voltage pulse 910 has a magnitude of Vv (see FIG. 7A) and represents the system performing program verification (step 874) between the doses of programming (successive iterations of step 872).

Figure 11:
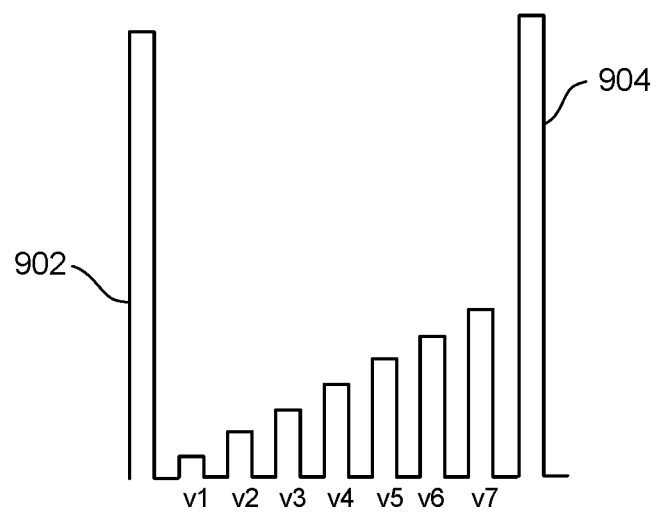
FIG. 11 depicts a two programming voltage pulses and a set of verify voltage pulses.

FIG. 11, which illustrates an embodiment in which memory cells store three bits of data per memory cell (e.g., as illustrated in FIGS. 7B-C), depicts two of the programming voltage pulses 902 and 904 of FIG. 9. Between programming voltage pulses 902 and 904 are verify voltage pulses v1, v2, v3, v4, v5, v6 and v7. In one embodiment, verify voltage pulse v1 has a magnitude of Vv1 (see FIG. 7B), verify voltage pulse v2 has a magnitude of Vv2, verify voltage pulse v3 has a magnitude of Vv3, verify voltage pulse v4 has a magnitude of Vv4, verify voltage pulse v5 has a magnitude of Vv5, verify voltage pulse v6 has a magnitude of Vv6, and verify voltage pulse v7 has a magnitude of Vv7. Verify voltage pulses v1, v2, v3, v4, v5, v6 and v7 represent the system performing program verification (step 874) between the doses of programming (successive iterations of step 872).

As previously shown at step 880 of FIG. 8, a program-verify operation includes obtaining a count of the number of cells that have not yet reached their respective target threshold voltage distribution (e.g., failed bit count, indicating the number of cells that have failed a program-verify step). In some cases, some or all memory cells of a column may not be programmed and/or read due to some defect(s). For example, a bit line may be defective (e.g., electrically discontinuous or electrically shorted to another component), one or more vertical columns in a 3D memory may be defective, or some other defect may cause some or all memory cells connected to a bit line to be unprogrammable and/or unreadable. If such memory cells are included when counting failed cells at step 880 because these cells cannot pass a verify status step, their inclusion may provide a high failed bit count, which may cause extra unnecessary programming pulses and/or program failure (e.g., as illustrated at step 888). Accordingly, in some examples, memory cells of identified bad columns may be excluded from failed bit counts.

FIG. 12A shows an example of circuits including a column 1200 of data latches (latches 0-15) and an isolation latch 1202 ("ISOLAT") that form part of latches 484 of sense amplifiers 350 (e.g., as shown in FIG. 4). Each latch 0-15 of column 1200 is configured to hold one bit of data for a total of 16 bits of data. Column 1200 may be connected to one or more bit lines and may be used to store data bits to be programmed in the memory cells of the bit lines during programming and may be used to store data bits obtained from memory cells of the bit lines during sensing (e.g., read or program-verify). For example, during a program-verify operation, latches 0-15 may store 16 bits of data that indicate whether 16 memory cells connected to 16 corresponding bit lines passed or failed program-verify (program-verify pass/fail bits). Latches 0-15 are connected by a line, or local data bus 1204 ("DBUS"), to allow bits from latches 0-15 to be read out to interface circuit 1206. Local data bus 1204 may also be connected to sense circuitry (e.g., sense circuitry 460, not shown in FIG. 4) to allow results of sense operations to be latched in latches 0-15. For example, data bus 454 of FIG. 4 may be formed by a portion of local data bus 1204. Interface circuit 1206 is connected to bit count circuit 1210 by a line or bus 1212 ("DNOR"), so that bits from latches 0-15 may also be sent to bit count circuit 1210 to obtain a failed bit count. While examples described in the present document show 16 latches in a column of data latches, any number of data latches may be provided (e.g., fewer than 16 or more than 16).

Isolation latch 1202 may hold a single bit that indicates if the corresponding column of memory cells (non-volatile memory cells whose program-verify pass/fail bits are in latches 0-15) is a bad column. Isolation latch 1202 is connected to interface circuit 1206 by line 1208 so that interface circuit 1206 can determine whether a corresponding column of memory cells is a bad column from an indicator bit stored in isolation latch 1202. When interface circuit 1206 determines from a bit in isolation latch 1202 that a corresponding column of memory cells is a bad column, interface circuit 1206 may block bits from latches 0-15, which were obtained from the bad column, and may not send such bits to bit count circuit 1210 (e.g., may cause a voltage on bus 1212 to correspond to a program-verify pass). By blocking bits from bad columns in this way, bit count circuit 1210 only receives and counts failed program-verify pass/fail bits from good columns and does not receive or count failed program-verify pass/fail bits from bad columns.

FIG. 12B shows a table that illustrates an example of operation of interface circuit 1206 including outputs from interface circuit 1206 on bus 1212 ("DNOR") for different values received from latches 0-15 on local data bus 1204 ("DBUS") and isolation latch 1202 ("ISOLAT"). Each latch 0-15 may contain a logical 1 indicating a program-verify pass for a corresponding memory cell or a logical 0 indicating a program-verify fail for a corresponding memory cell. Isolation latch 1202 may contain a logical 0 indicating a non-defective column or a logical 1 indicating a defective column. The output generated on bus 1212 is the same as the input received on local data bus 1204 from a latch except when the input on local data bus 1204 is a 0 (fail) and isolation latch 1202 contains a logical 1 (indicating a defective or bad column). In this condition, the output on bus 1212 indicates a pass (e.g., flipped or inverted compared with an input received on local data bus 1204) so that this bit is not counted in a failed bit count by bit count circuit 1210. The mapping of particular conditions (e.g., pass/fail and defective/non-defective) to logic bits (1 and 0) may be different to the example shown. For example, a program-verify pass could be represented by logic 0 and a fail represented by a logic 1. Bit count circuit 1210 may count bits that indicate program-verify fails (e.g., count the number of logic 0 bits in the example of FIG. 12B) or may count the bits that indicate program-verify passes (e.g., count the number of logic 1 bits in the example of FIG. 12B) to determine the number of non-volatile memory cells in a given population that have passed program-verify.

Data latches (e.g., data latches 484) may be appropriately located according to the non-volatile memory device in which they are used. For example, in a memory system that includes one or more monolithic three dimensional (3D) memory arrays (e.g., memory structure 302 as illustrated in the example of FIG. 5), data latches may be located under the 3D memory structure (e.g., between the 3D memory structure and a substrate). In a memory system that includes one or more two dimensional (2D) arrays, data latches may be located in a peripheral area of a substrate surface.

FIG. 13 illustrates an example of a cross-sectional view of a portion of a memory die or integrated memory assembly (e.g., memory die 300 or integrated memory assembly 307), including peripheral circuits 1322 and column control circuit 310, which includes data latches 484. Peripheral circuits 1322 (e.g., logic circuits that may be connected to column control circuits 310) and column control circuits 310 are located over a substrate. For example, a memory die may be formed by forming peripheral circuits 1322 and control circuit 310 on a substrate (which has a primary surface extending perpendicular to the z-direction, along an x-y plane), followed by forming memory array 302. An integrated memory assembly may be formed by forming peripheral circuits 1322 on a substrate, followed by forming column control circuit 310 and then bonding memory array 302 (e.g., formed on a separate substrate) to column control circuits 310. It can be seen that column control circuit 310, including data latches 484 contribute to the dimensions of the overall structure (e.g., along x-direction in FIG. 13). Excessive size may be problematic so that configuring column control circuit 310, including data latches 484, to avoid excessive size may be desirable.

Figure 14:
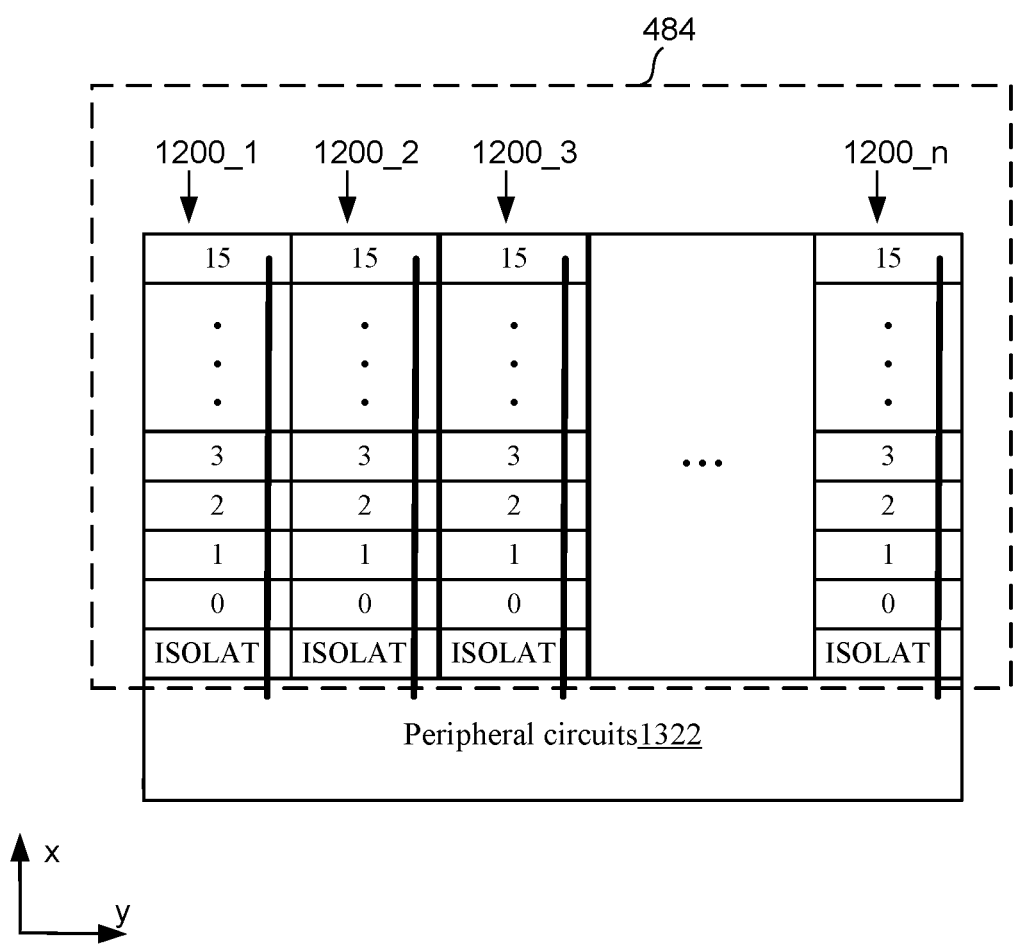
FIG. 14 illustrates an example of columns of latches in which each column has a single local data bus.

FIG. 14 shows an example implementation of a portion of data latches 484 that are located over and connected to peripheral circuits 1322. Data latches 484 include n columns of data latches including columns 1200_1, 1200_3, 1200_3 . . . 1200_n where n may be any number greater than 3. Each column 1200_1-1200_n may be identical to column 1200 of FIG. 12A and may be similarly connected to interface circuits by a local data bus with an isolation latch to enable blocking of program-verify fail bits from non-volatile memory cells of bad columns. Peripheral circuits 1322 may include, or may connect to, interface circuits (e.g., interface circuit 1206) and a bit count circuit (e.g., bit count circuit 1210).

FIG. 15A shows another example implementation in which n columns of data latches, 1528_1-1528_n, are split into first portions 1530 (top portions, in this example, including latches 9-15) and second portions 1532 (bottom portions, in this example, including latches 0-7). Columns 1528_1-1528_n may be identical. Each top portion has a corresponding local data bus and a corresponding isolation latch. Each bottom portion has a corresponding local data bus and a corresponding isolation latch. Peripheral circuits 1534 extend between first portions 1530 and second portions 1532 and may include suitable circuits for interfacing with latches (e.g., may include interface circuits and a bit count circuit).

FIG. 15B illustrates an example column of data latches, column 1528_1, in more detail including a first plurality of data latches 1540 (latches 8-15) connected to a first local data bus 1542 and a second plurality of data latches 1544 (latches 0-7) connected to a second local data bus 1546. A first isolation latch 1548 and first interface circuit 1550 enable blocking of program-verify pass/fail bits from first plurality of data latches 1540 (e.g., as described with respect to interface circuit 1206 of FIGS. 12A-B). A second isolation latch 1552 and second interface circuit 1554 enable blocking of program-verify pass/fail bits from second plurality of data latches 1544. Thus, bits sent to bit count circuit 1210 may be selectively blocked to avoid counting program-verify fails obtained from bad columns (as indicated by indicator bits in isolation latches 1548, 1552).

The arrangement of FIGS. 15A-B may have several advantages over the arrangement of FIG. 14. For example, arranging data latches of a column in two groups, each with its own local data bus, may allow some parallel operation of each group of data latches using their separate local data busses. For example, where a data bus allows data latches to be accessed sequentially, accessing 8 latches sequentially (8 latches connected to each local data bus in FIGS. 15A-B) takes about half as much time as accessing 16 latches sequentially (16 latches connected to one local data bus in FIG. 14). Shorter local data busses may have less propagation delay and shorter local data busses may each charge up and discharge faster than a longer local data bus so that operations using two local data busses may be faster than using a single local data bus.

Having two isolation latches (e.g., isolation latches 1584 and 1552) and two interface circuits (e.g., interface circuits 1550 and 1554) may use more space than having a single isolation latch and a single interface circuit (e.g., as shown in FIGS. 12A and 14). It may be desirable to separate a column of data latches into two groups, each with a its own local data bus, while not unnecessarily increasing overall space used.

Figures 16A, 16B:
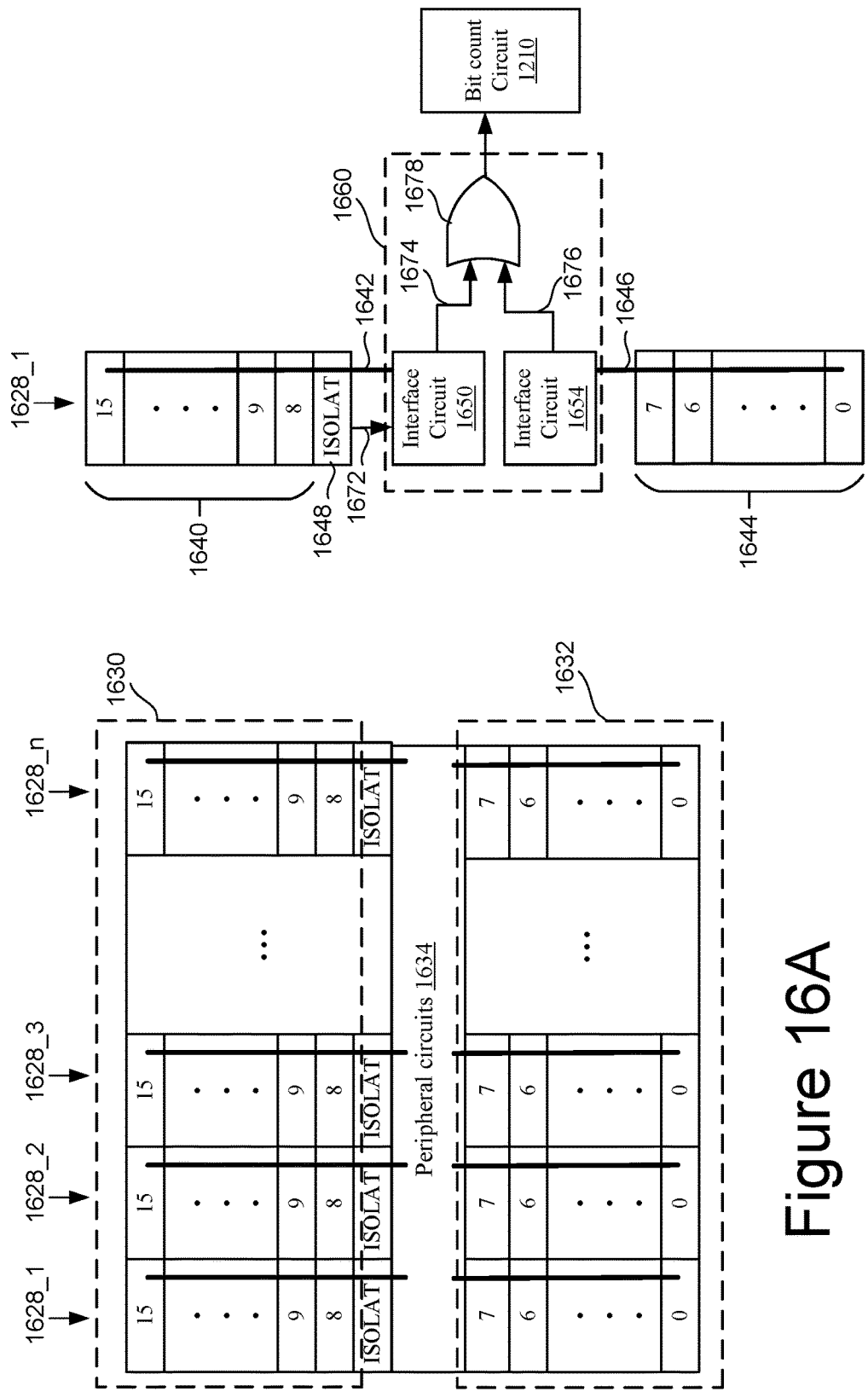

FIG. 16A-C illustrate an example in which each column of data latches includes two groups of data latches, each with its own local data bus, with a shared data isolation latch that is used for selectively blocking program-verify pass/fail bits for both groups of data latches.

FIG. 16A shows an example implementation in which n columns of data latches, 1628_1-1628_n, are split into first portions 1630 (top portions, in this example, including latches 9-15) and second portions 1632 (bottom portions, in this example, including latches 0-7). Columns 1628_1-1628_n may be identical. Each top portion has a corresponding local data bus and a corresponding isolation latch. Each bottom portion has a corresponding local data bus but does not have a corresponding isolation latch. Peripheral circuits 1634 extend between first portions 1630 and second portions 1632 and may include suitable circuits for interfacing with latches (e.g., may include interface circuits and a bit count circuit).

FIG. 16B illustrates an example column of data latches, column 1628_1, in more detail including a first plurality of data latches 1640 (latches 8-15) connected to a first local data bus 1642 and a second plurality of data latches 1644 (latches 0-7) connected to a second local data bus 1646. A shared isolation latch 1648 and interface circuits 1660 enable blocking of program-verify pass/fail bits from first plurality of data latches 1640 and from second plurality of data latches 1644 of column 1628_1 according to an indicator bit in shared isolation latch 1648 (e.g., an indicator bit that indicates that a column of non-volatile memory cells from which the contents of data latches 1640 and 1644 were obtained is a bad column). While shared isolation latch 1648 is shown located above interface circuits 1660 (with first plurality of data latches 1640) in FIG. 16B (and above peripheral circuits 1643 in FIG. 16A), shared isolation latches may be located differently. For example, isolation latch 1648 may be located below interface circuits 1660 (with second plurality of data latches 1644) or elsewhere.

Interface circuits 1660 include first interface circuit 1650, which is connected to first plurality of data latches 1640 by first local data bus 1642 (top local data bus, or "DBUS_T") and to shared isolation latch 1648 by line 1672 so that the output of first interface circuit 1650 on output line 1674 (top output line DNOR_T) may depend on a bit read from a data latch of data latches 1640 in combination with an indicator bit obtained from shared isolation latch 1648 ("ISOLAT"). A second interface circuit 1654 is connected to second local data bus 1646 (bottom local data bus, or "DBUS_B") and generates an output on output line 1676 (bottom output line, or "DNOR_B") according to a bit obtained from a latch of data latches 1644 over second local data bus 1646. The output on second (bottom) output line 1676 may be identical to the bit received on second local data bus 1646 (e.g., DBUS_B=DNOR_B) in a program-verify operation so that interface circuit 1654 may directly couple second local data bus 1646 and second (bottom) output line 1676 during program-verify operations. The output lines 1674 and 1676 are connected as input lines to OR gate 1678, which outputs a logical OR of the input bits received on lines 1674 and 1676 to bit count circuit 1210, which may be considered a means for counting non-volatile memory cells that fail program-verify.

The examples of FIGS. 16A-B show shared isolation latch 1648 performing the function previously performed to two isolation latches 1548 and 1552 in FIG. 15B, thereby enabling a reduction of one latch (e.g., reduction of in a range of 3-5 microns along the x-direction). In some examples, data latches 484 may include stacked columns of data latches (e.g., two levels of data latches, each level including first portions and second portions connected by peripheral circuits (e.g., first portions 1630 and second portions 1632 connected by peripheral circuits 1634) so that the total reduction may be two latches (e.g., in a range of 6-10 microns). Where more than two levels of data latches are used, space saving may be greater.

Operation of the apparatus illustrated in FIG. 16B is illustrated in the examples shown in the tables of FIGS. 16C and 16D, which correspond to counting program-verify pass/fail bits from the top group of data latches (first plurality of data latches 1640) and from the bottom group of data latches (second plurality of data latches 1644) respectively.

The table of FIG. 16C includes a first column ("DL") that shows pass/fail bits from data latches of first plurality of data latches 1640, where a logic 1 indicates a program-verify pass and a logic 0 indicates a program-verify fail. A second column ("DBUS_T") shows a bit sent on first local data bus 1642, which is identical to the DL value. A third column ("ISOLAT") shows indicator bits stored in shared isolation latch 1648, with a 0 indicating a non-defective (e.g., functioning) column of non-volatile memory cells and a 1 indicating a defective (e.g., non-functioning or bad) column of non-volatile memory cells. A bad column may be detected during testing. Subsequently, an indicator bit in shared isolation latch 1648 of a corresponding column of data latches may be set to logic 1 whenever a program-verify operation includes the bad column. Otherwise (when the corresponding column of memory cells is not defective and the indicator bit is not set), the indicator bit in shared isolation latch 1648 indicates logic 0. A fourth column ("DNOR_T") shows the output of first interface circuit 1650 on output line 1674 and shows blocking of a program-verify pass/fail when the indicator bit in shared isolation latch 1648 indicates a defective column (second and fourth rows). A fifth column ("DBUS_B=DNOR_B") shows a logic value that is identical on second data bus 1646 (bottom data bus, DBUS_B) and second output line 1676 (bottom output line DNOR_B) and is maintained at logic 0 when counting program-verify pass/fail bits from first (top) plurality of data latches 1640 (e.g., by connecting second local data bus 1646 to a constant voltage that corresponds to logic 0 by a switch). A sixth column shows the result of OR operations on the fourth and fifth columns (e.g., output of OR gate 1678 from inputs on lines 1674 and 1676). Because the input on second (bottom) data output line 1676 (DNOR_B) is 0 in each row, the result of the OR operations reflects the logic of first (top)

data output line 1674 (DNOR_T). Thus, bits indicating program-verify failures from first plurality of data latches 1640 are blocked whenever the indicator bit in shared isolation latch 1648 is set.

The table of FIG. 16D includes a first column ("DBUS_T") that shows logic 0 asserted on first local data bus 1642 when counting program-verify pass/fail bits from second (bottom) plurality of data latches 1644. For example, first local data bus 1642 may be connected to a constant voltage that corresponds to a logic 0 (e.g., via a switch). A second column ("ISOLAT") shows indicator bits stored in shared isolation latch 1648, with a 0 indicating a non-defective (e.g., functioning) column of non-volatile memory cells and a 1 indicating a defective (e.g., non-functioning) column of non-volatile memory cells as before. A third column ("DNOR_T") shows the output on first (top) output line 1674, which is identical to the indicator bit of the second column (identical to "ISOLAT"). A fourth column ("DL") shows program-verify pass/fail bits obtained from second plurality of data latches 1644, with logic 1 corresponding to a program-verify pass and logic 0 corresponding to a program-verify fail as before. A fifth column ("DBUS_B=DNOR_B") shows a logic bit on second (bottom) local data bus 1646 and second output line 1676, which has identical entries to the fourth column (e.g., a program-verify pass/fail from a data latch passes via second local data bus 1646 and second output line 1676 unchanged). A sixth column ("OR") shows the result of OR operations on the third and fifth columns (e.g., output of OR gate 1678 from inputs on lines 1674 and 1676). A bit received on first output line 1674 (DNOR_T) is identical to the indicator bit in shared isolation latch 1648 so that obtaining a logical OR of this bit with program-verify pass/fail bits blocks program-verify fail bits whenever the indicator bit (ISOLAT) indicates a defective column (bottom row). Thus, program-verify fails from second plurality of data latches 1644 are blocked whenever the indicator bit in shared isolation latch 1648 is set.

The tables of FIGS. 16C-D illustrated the operation of certain components shown in FIGS. 16A-B including interface circuits 1660, which may be considered means for selectively blocking (or circuits configured to selectively block) any first and second program-verify pass/fail bits from the first and second groups of latches that indicate program-verify failure (logic 0 in FIGS. 16C-D) whenever an indictor bit is set in the shared isolation latch (logic 1 in FIGS. 16C-D) so that they are not counted by the means for counting non-volatile memory cells that fail program-verify.

Figure 17:
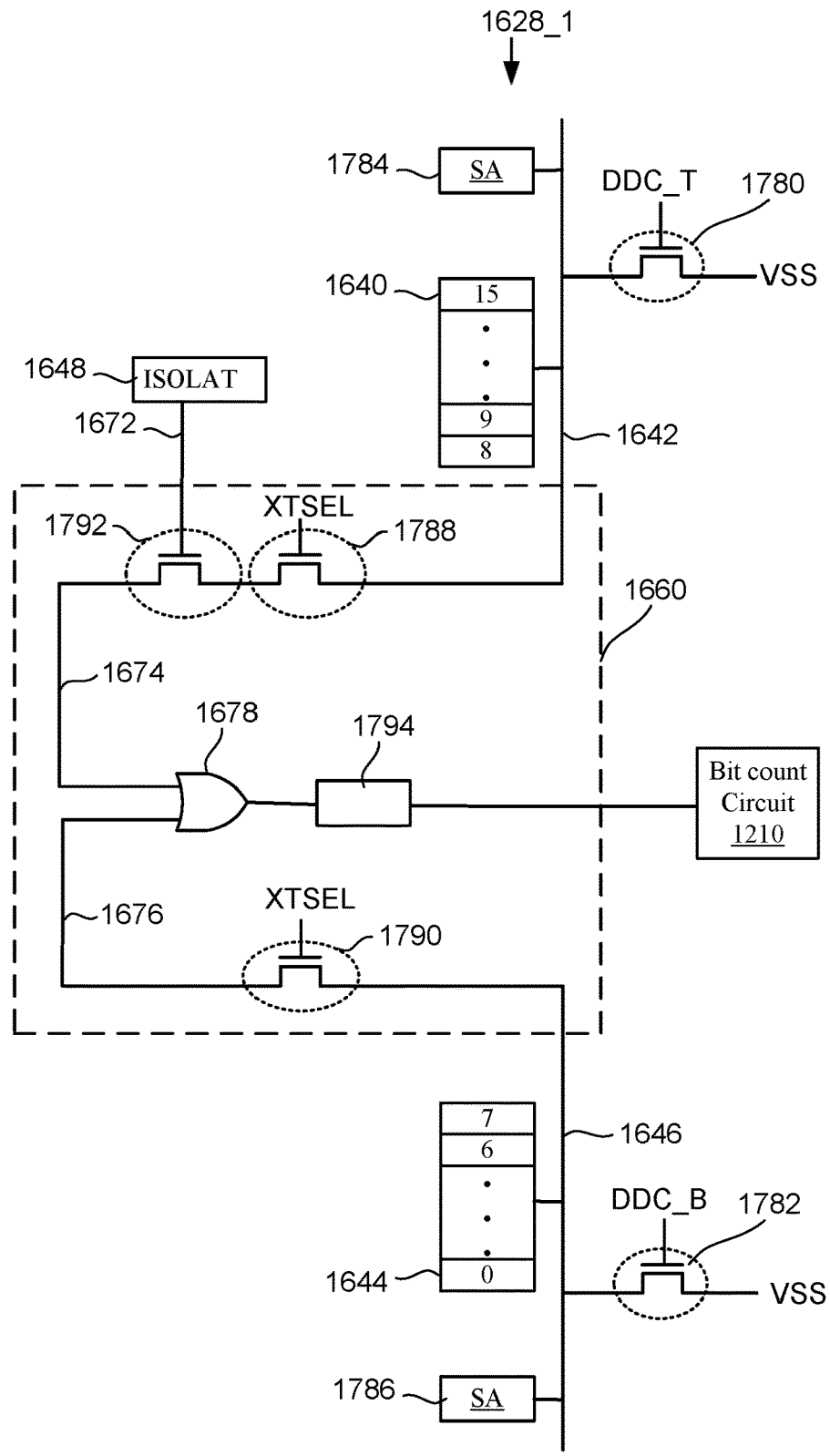
FIG. 17 illustrates an example implementation of a column of latches having two local data busses and a shared isolation latch.

FIG. 17 shows an example implementation of the circuits of column 1628_1 illustrated in FIG. 16B including components of interface circuits 1660. FIG. 17 shows first plurality of data latches 1640 (latches 8-15) connected to first local data bus 1642 and second plurality of data latches 1644 (latches 0-7) connected to a second local data bus 1646 as before. In addition, FIG. 17 shows a first switch 1780 that is connected between first local data bus 1642 and a constant voltage VSS (e.g., ground, or a low voltage). First switch 1780 is controlled by a control signal, DDC_T, to selectively connect first local data bus 1642 to VSS (e.g., to discharge first local data bus 1642 to a discharged voltage). For example, when obtaining program-verify pass/fail bits from second plurality of data latches 1644, first local data bus 1642 may be discharged to VSS, which corresponds to logic 0 (e.g., as shown in the first column of FIG. 16D). FIG. 17 also shows a second switch 1782 that is connected between second local data bus 1646 and constant voltage VSS (e.g., ground, or a low voltage). Second switch 1782 is controlled by a control signal, DDC_B, to selectively connect second local data bus 1646 to VSS (e.g., to discharge second local data bus 1646 to a discharged voltage). For example, when obtaining program-verify pass/fail bits from first plurality of data latches 1640, second local data bus 1646 may be discharged to VSS, which corresponds to logic 0 or a fail condition (e.g., as shown in the fifth column of FIG. 16C).

FIG. 17 also shows first sense amplifier 1784 connected to first local data bus 1642 to allow data to be sensed on a bit line and transferred to first plurality of data latches 1640. Second sense amplifier 1786 is connected to second local data bus 1646 to allow data to be sensed on the bit line and transferred to the second plurality of data latches 1644. First sense amplifier 1784 and second sense amplifier 1786, which may be connected to different bit lines, sense whether non-volatile memory cells connected to the bit lines have passed program-verify and store the resulting program-verify pass/fail bits in respective data latches. Sense amplifiers 1784 and 1786 may be located in sense circuitry 460.

FIG. 17 shows an example of components used to implement interface circuits 1660 including a first select switch 1788 and a second select switch 1790, which are both controlled by a control signal XTSEL to allow selection (connection) and isolation (disconnection) of column 1628_1 (additional connected columns of data latches of additional bit lines may be similarly selected by respective switches). An isolation switch 1792 is controlled by shared isolation latch 1648 so that when the indicator bit is set, isolation switch 1792 isolates first local data bus 1642 from first output line 1674 causing a logic 1 to be output on first output line 1674 to OR gate 1678. The output of OR gate 1678 goes to a latch 1794, which provides the output to bit count circuit 1210. Control signals for controlling switches 1780, 1782, 1788, 1790, and 1792 may be generated by an appropriate control circuit (e.g., state machine 362).

Figure 18:
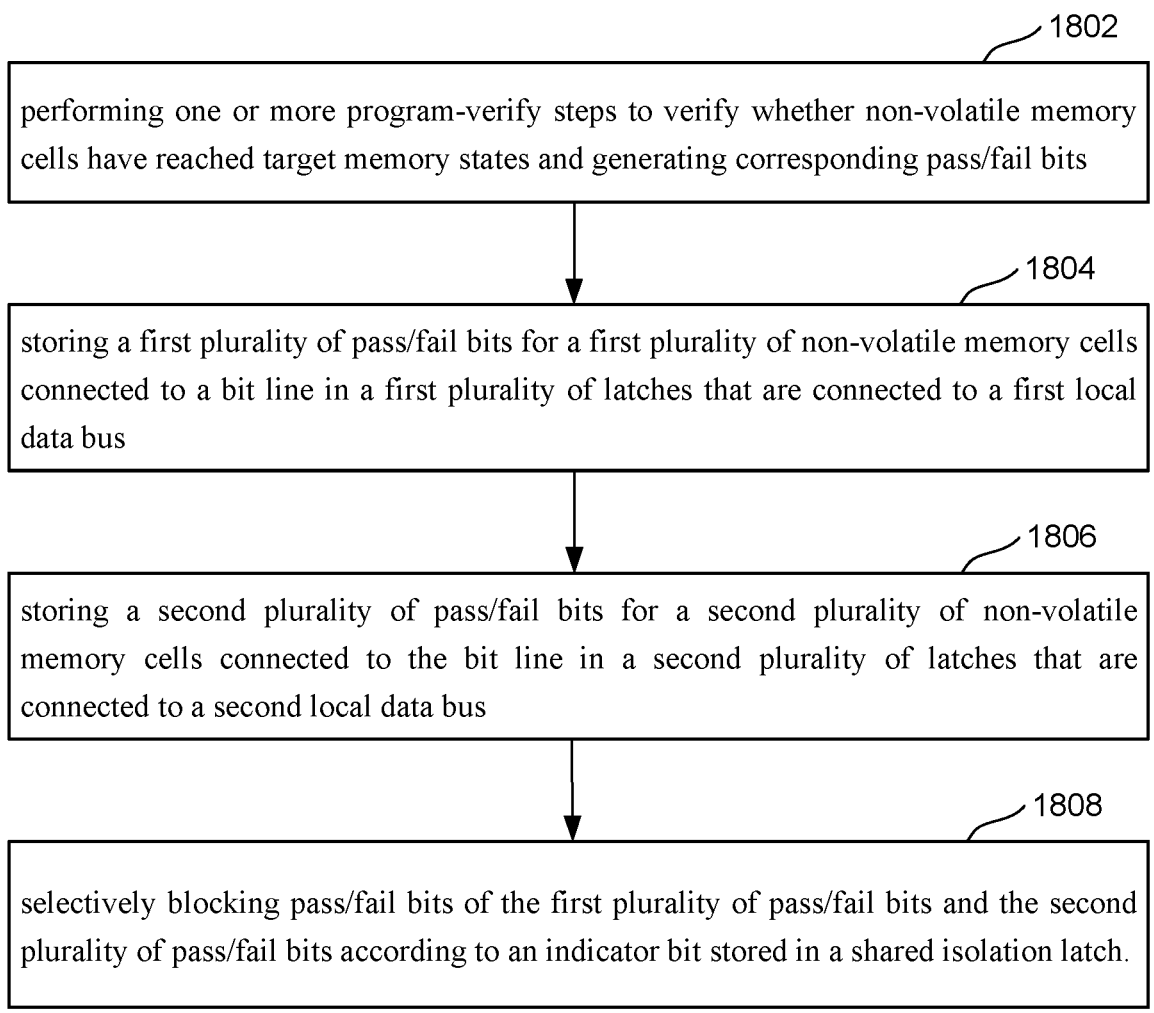
FIG. 18 illustrates a method that includes selectively blocking pass/fail bits according to an indicator bit in a shared latch.

FIG. 18 illustrates an example of a method that may be implemented using suitable circuits, for example, as illustrated in the examples FIGS. 16A-17. The method includes performing one or more program-verify steps to verify whether non-volatile memory cells have reached target memory states and generating corresponding pass/fail bits 1802, storing a first plurality of pass/fail bits for a first plurality of non-volatile memory cells in a first plurality of latches that are connected to a first local data bus 1804, and storing a second plurality of pass/fail bits for a second plurality of non-volatile memory cells in a second plurality of latches that are connected to a second local data bus 1806. The method further includes selectively blocking pass/fail bits of the first plurality of pass/fail bits and the second plurality of pass/fail bits according to an indicator bit stored in a shared isolation latch 1808 (e.g., selectively blocking bits from first plurality of data latches 1640 and bits from second plurality of data latches 1644 according to an indicator bit in shared isolation latch 1648. While not shown in FIG. 18, the method may include additional steps including, prior to performing the one or more program-verify steps, identifying a column of non-volatile memory cells containing the first plurality of non-volatile memory cells and the second plurality of non-volatile memory cells as a bad column; and in response to identifying the column of non-volatile memory cells as a bad column, setting the indicator bit to indicate a bad column.

An example of a non-volatile memory device includes a control circuit configured to connect to a bit line that is connected to one or more non-volatile memory cells, the control circuit comprising: a first plurality of data latches connected to a first local data bus, the first plurality of data latches configured to store first program-verify pass/fail bits for first non-volatile memory cells connected to the bit line and a second plurality of data latches connected to a second local data bus, the second plurality of data latches configured to store second program-verify pass/fail bits for second non-volatile memory cells connected to the bit line. The non-volatile memory device further includes a shared isolation latch and one or more interface circuits connected to the first local data bus and the second local data bus. The one or more interface circuits are configured to selectively block the first program-verify pass/fail bits from the first plurality of latches and the second program-verify pass/fail bits from the second plurality of latches according to an indicator bit stored in the shared isolation latch.

The indicator bit may indicate whether a column of memory cells connected to the bit line is a bad column, the one or more interface circuits may be configured to block only the first and second program-verify pass/fail bits that indicate program-verify fail for non-volatile memory cells in bad columns. The non-volatile memory device may further include a bit count circuit connected to the interface circuits, the bit count circuit configured to count a number of cells that have failed a program-verify step from bits output by the one or more interface circuits. The one or more interface circuits may be configured to selectively block the first and second program-verify pass/fail bits from bad columns to cause the bit count circuit to not count the first and second program-verify pass/fail bits of bad columns in the number of non-volatile memory cells that have failed the program-verify step. The one or more interface circuits may include: a first interface circuit connected to the first local data bus and the shared isolation latch, the first interface circuit configured to generate a first bit; a second interface circuit connected to the second local data bus, the second interface circuit configured to generate a second bit; and an OR gate configured to receive the first bit and the second bit as inputs and to output a logical OR of the first and second bits to a bit count circuit. The first interface circuit may be configured to generate the first bit indicating a program-verify pass whenever the indicator bit is set and generate the first bit such that the first bit is identical to the bit received on the first local data bus whenever the indicator bit is not set. The non-volatile memory device may further include a first switch connected to the first local data bus to discharge the first local data bus and a second switch connected to the second local data bus to discharge the second local data bus. The non-volatile memory device may further include one or more switches to enable the control circuit to disconnect from the bit line and to connect to one or more additional bit lines. The non-volatile memory device may further include a 3D non-volatile memory structure including the bit line and the one or more non-volatile memory cells, the 3D non-volatile memory structure may be located over the control circuit such that the control circuit is located between the 3D non-volatile memory structure and a substrate. The control circuit may be formed on a control die, the non-volatile memory device may further include a memory die including the non-volatile memory cells, the memory die formed separately from and bonded to the control die.

An example of a method includes: performing one or more program-verify steps to verify whether non-volatile memory cells have reached target memory states and generating corresponding pass/fail bits; storing a first plurality of pass/fail bits for a first plurality of non-volatile memory cells in a first plurality of latches that are connected to a first local data bus; and storing a second plurality of pass/fail bits for a second plurality of non-volatile memory cells in a second plurality of latches that are connected to a second local data bus. The method further includes selectively blocking pass/fail bits of the first plurality of pass/fail bits and the second plurality of pass/fail bits according to an indicator bit stored in a shared isolation latch.

The method may further include, prior to performing the one or more program-verify steps, identifying a column of non-volatile memory cells containing the first plurality of non-volatile memory cells and the second plurality of non-volatile memory cells as a bad column; and in response to identifying the column of non-volatile memory cells as a bad column, setting the indicator bit to indicate a bad column. The selective blocking may include blocking only pass/fail bits that indicate program-verify failures of memory cells of bad columns that are indicated as bad by a corresponding indicator bit to indicate a program-verify pass for all non-volatile memory cells of bad columns. The method may further include counting a number of the non-volatile memory cells that have failed program-verify, with the pass/fail bits that indicate program-verify failures of memory cells of bad columns being blocked and not counted in the number of the non-volatile memory cells that have failed program-verify. The method may further include discharging the first local data bus to access the second plurality of latches and discharging the second local data bus to access the first plurality of latches. Selectively blocking pass/fail bits of the first plurality of pass/fail bits may include selectively blocking pass/fail bits of the first plurality of pass/fail bits according to the indicator bit to generate a first bit; while selectively blocking pass/fail bits of the first plurality of pass/fail bits according to the indicator bit, maintaining the second local data bus at a discharged voltage to generate a second bit; and performing an OR operation on the first bit and the second bit to generate a pass/fail bit for counting non-volatile memory cells that fail program-verify. Selectively blocking pass/fail bits of the second plurality of pass/fail bits may include selectively generating the first bit according to the indicator bit while maintaining the first local data bus at a discharged voltage; while selectively generating the first bit, generating the second bit such that the second bit is identical to a pass/fail bit on the second local data bus; and performing an OR operation on the first bit and the second bit to generate a pass/fail bit for counting non-volatile memory cells that fail program-verify.

An example of a non-volatile memory device includes a plurality of non-volatile memory cells arranged in columns of non-volatile memory cells connected to bit lines and a control circuit configured to connect to a bit line for program-verify of non-volatile memory cells connected to the bit line, the control circuit comprising: a first plurality of data latches connected to a first local data bus, the first plurality of data latches configured to store first program-verify pass/fail bits for first non-volatile memory cells and a second plurality of data latches connected to a second local data bus, the second plurality of data latches configured to store second program-verify pass/fail bits for second non-volatile memory cells. The non-volatile memory device further includes means for counting non-volatile memory cells that fail program-verify, a shared isolation latch, and means for selectively blocking any first and second program-verify pass/fail bits from the first and second pluralities of latches that indicate program-verify failure whenever an indictor bit is set in the shared isolation latch so that they are not counted by the means for counting non-volatile memory cells that fail program-verify.

The plurality of non-volatile memory cells may be located on a memory die and the control circuit may be located on a control die. The control circuit may be located between the plurality of non-volatile memory cells and a substrate.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory device, comprising:
   a control circuit configured to connect to a bit line that is connected to one or more non-volatile memory cells, the control circuit comprising:
      a first plurality of data latches connected to a first local data bus, the first plurality of data latches configured to store first program-verify pass/fail bits for first non-volatile memory cells connected to the bit line;
      a second plurality of data latches connected to a second local data bus, the second plurality of data latches configured to store second program-verify pass/fail bits for second non-volatile memory cells connected to the bit line;
      a shared isolation latch; and
      one or more interface circuits connected to the first local data bus and the second local data bus, the one or more interface circuits configured to selectively block the first program-verify pass/fail bits from the first plurality of latches and the second program-verify pass/fail bits from the second plurality of latches according to an indicator bit stored in the shared isolation latch.

2. The non-volatile memory device of claim 1, wherein the indicator bit indicates whether a column of memory cells connected to the bit line is a bad column, the one or more interface circuits are configured to block only the first and second program-verify pass/fail bits that indicate program-verify fail for non-volatile memory cells in bad columns.

3. The non-volatile memory device of claim 2, further comprising a bit count circuit connected to the interface circuits, the bit count circuit configured to count a number of cells that have failed a program-verify step from bits output by the one or more interface circuits.

4. The non-volatile memory device of claim 3, wherein the one or more interface circuits are configured to selectively block the first and second program-verify pass/fail bits from bad columns to cause the bit count circuit to not count the first and second program-verify pass/fail bits of bad columns in the number of non-volatile memory cells that have failed the program-verify step.

5. The non-volatile memory device of claim 1, wherein the one or more interface circuits include:
   a first interface circuit connected to the first local data bus and the shared isolation latch, the first interface circuit configured to generate a first bit;
   a second interface circuit connected to the second local data bus, the second interface circuit configured to generate a second bit; and
   an OR gate configured to receive the first bit and the second bit as inputs and to output a logical OR of the first and second bits to a bit count circuit.

6. The non-volatile memory device of claim 5, wherein the first interface circuit is configured to:
   generate the first bit indicating a program-verify pass whenever the indicator bit is set; and
   generate the first bit such that the first bit is identical to the bit received on the first local data bus whenever the indicator bit is not set.

7. The non-volatile memory device of claim 6, further comprising a first switch connected to the first local data bus to discharge the first local data bus and a second switch connected to the second local data bus to discharge the second local data bus.

8. The non-volatile memory device of claim 1, further comprising one or more switches to enable the control circuit to disconnect from the bit line and to connect to one or more additional bit lines.

9. The non-volatile memory device of claim 1, further comprising a 3D non-volatile memory structure including the bit line and the one or more non-volatile memory cells, the 3D non-volatile memory structure located over the control circuit such that the control circuit is located between the 3D non-volatile memory structure and a substrate.

10. The non-volatile memory device of claim 1, wherein the control circuit is formed on a control die, the non-volatile memory device further comprising:
    a memory die including the non-volatile memory cells, the memory die formed separately from and bonded to the control die.

11. A method, comprising:
    performing one or more program-verify steps to verify whether non-volatile memory cells have reached target memory states and generating corresponding pass/fail bits;
    storing a first plurality of pass/fail bits for a first plurality of non-volatile memory cells connected to a bit line in a first plurality of latches that are connected to a first local data bus;
    storing a second plurality of pass/fail bits for a second plurality of non-volatile memory cells connected to the bit line in a second plurality of latches that are connected to a second local data bus; and selectively blocking pass/fail bits of the first plurality of pass/fail bits and the second plurality of pass/fail bits according to an indicator bit stored in a shared isolation latch.

12. The method of claim 11, further comprising:
prior to performing the one or more program-verify steps, identifying a column of non-volatile memory cells containing the first plurality of non-volatile memory cells and the second plurality of non-volatile memory cells as a bad column; and
in response to identifying the column of non-volatile memory cells as a bad column, setting the indicator bit to indicate a bad column.

13. The method of claim 12, wherein selectively blocking includes blocking only pass/fail bits that indicate program-verify failures of memory cells of bad columns that are indicated as bad by a corresponding indicator bit to indicate a program-verify pass for all non-volatile memory cells of bad columns.

14. The method of claim 13, further comprising:
counting a number of the non-volatile memory cells that have failed program-verify, wherein the pass/fail bits that indicate program-verify failures of memory cells of bad columns are blocked and not counted in the number of the non-volatile memory cells that have failed program-verify.

15. The method of claim 11, further comprising:
discharging the first local data bus to access the second plurality of latches; and
discharging the second local data bus to access the first plurality of latches.

16. The method of claim 11, wherein selectively blocking pass/fail bits of the first plurality of pass/fail bits includes:
selectively blocking pass/fail bits of the first plurality of pass/fail bits according to the indicator bit to generate a first bit;
while selectively blocking pass/fail bits of the first plurality of pass/fail bits according to the indicator bit, maintaining the second local data bus at a discharged voltage to generate a second bit; and
performing an OR operation on the first bit and the second bit to generate a pass/fail bit for counting non-volatile memory cells that fail program-verify.

17. The method of claim 16, wherein selectively blocking pass/fail bits of the second plurality of pass/fail bits includes:

selectively generating the first bit according to the indicator bit while maintaining the first local data bus at a discharged voltage;
while selectively generating the first bit, generating the second bit such that the second bit is identical to a pass/fail bit on the second local data bus; and
performing an OR operation on the first bit and the second bit to generate a pass/fail bit for counting non-volatile memory cells that fail program-verify.

18. A non-volatile memory device, comprising:
a plurality of non-volatile memory cells arranged in columns of non-volatile memory cells connected to bit lines; and
a control circuit configured to connect to a bit line for program-verify of non-volatile memory cells connected to the bit line, the control circuit comprising:
a first plurality of data latches connected to a first local data bus, the first plurality of data latches configured to store first program-verify pass/fail bits for first non-volatile memory cells connected to the bit line;
a second plurality of data latches connected to a second local data bus, the second plurality of data latches configured to store second program-verify pass/fail bits for second non-volatile memory cells connected to the bit line;
means for counting non-volatile memory cells that fail program-verify;
a shared isolation latch; and
means for selectively blocking any first and second program-verify pass/fail bits from the first and second pluralities of latches that indicate program-verify failure whenever an indictor bit is set in the shared isolation latch so that they are not counted by the means for counting non-volatile memory cells that fail program-verify.

19. The non-volatile memory device of claim 18, wherein the plurality of non-volatile memory cells are located on a memory die and the control circuit is located on a control die.

20. The non-volatile memory device of claim 18, wherein the control circuit is located between the plurality of non-volatile memory cells and a substrate.

* * * * *